(12) United States Patent
Yu et al.

(10) Patent No.: US 11,972,726 B2
(45) Date of Patent: Apr. 30, 2024

(54) LIGHT EMITTING DISPLAY DEVICE

(71) Applicant: Samsung Display Co., LTD., Yongin-si (KR)

(72) Inventors: Byung Chang Yu, Seosan-si (KR); Hyun Joon Kim, Hwaseong-si (KR); Hae Min Kim, Gumi-si (KR); Myunghoon Park, Hwaseong-si (KR); Dong-Hoon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/990,813

(22) Filed: Nov. 21, 2022

(65) Prior Publication Data
US 2023/0162679 A1 May 25, 2023

(30) Foreign Application Priority Data
Nov. 25, 2021 (KR) .................. 10-2021-0164664

(51) Int. Cl.
*G09G 3/3233* (2016.01)
*H10K 59/131* (2023.01)

(52) U.S. Cl.
CPC ... *G09G 3/3233* (2013.01); *G09G 2300/0426* (2013.01); *G09G 2300/0819* (2013.01); *G09G 2300/0842* (2013.01); *G09G 2320/0626* (2013.01); *H10K 59/131* (2023.02)

(58) Field of Classification Search
CPC ............................... H10K 59/00–95
See application file for complete search history.

(56) References Cited

FOREIGN PATENT DOCUMENTS

| KR | 10-1289631 | 7/2013 |
|----|------------|--------|
| KR | 10-1495359 | 2/2015 |
| KR | 10-1666589 | 10/2016 |
| KR | 10-1950848 | 2/2019 |
| KR | 10-2023232 | 9/2019 |

*Primary Examiner* — Sanjiv D. Patel
(74) *Attorney, Agent, or Firm* — KILE PARK REED & HOUTTEMAN PLLC

(57) ABSTRACT

A light emitting display device includes a light emitting diode including a first electrode and a second electrode to which a driving voltage is applied, a driving transistor, a second transistor receiving a data voltage and connected to a D node, a storage capacitor connected to the driving transistor and an N node, a hold capacitor connected to the D node and the N node, a third transistor connected to the D node and the driving transistor, a fourth transistor receiving a reference voltage and connected to the driving transistor, a fifth transistor connected to the driving transistor and the N node, a sixth transistor receiving a driving low voltage and connected to the driving transistor, a seventh transistor receiving an initialization voltage and connected the driving transistor, and an eighth transistor connected to the driving transistor and the first electrode of the light emitting diode.

9 Claims, 17 Drawing Sheets

LIGHT EMITTING DISPLAY DEVICE

CROSS-REFERENCE TO RELATED APPLICATION(S)

This application claims priority to and the benefits of Korean Patent Application No. 10-2021-0164664 under 35 U.S.C. § 119, filed on Nov. 25, 2021, in the Korean Intellectual Property Office, the entire contents of which are incorporated herein by reference.

BACKGROUND

1. Technical Field

The disclosure relates to a light emitting display device including a pixel in which a light emitting element is disposed at a driving voltage ELVDD side with respect to a driving transistor.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

A display device such as an organic light emitting display device may have a structure that can be bent or folded by using a flexible substrate.

A structure of a pixel used in the organic light emitting device is being variously developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments are to provide an inverted pixel in which a light emitting element is disposed at a driving voltage (ELVDD) side based with respect to a driving transistor.

An embodiments provides a light emitting display device that may include a light emitting diode including a first electrode and a second electrode to which a driving voltage is applied, a driving transistor including a gate electrode, a first electrode, and a second electrode, a second transistor including a gate electrode, a first electrode electrically connected to a data line to which a data voltage is applied, and a second electrode electrically connected to a D node, a storage capacitor including a first electrode electrically connected to the first electrode of the driving transistor and a second electrode electrically connected to an N node, a hold capacitor including a first electrode electrically connected to the D node and a second electrode electrically connected to the N node, a third transistor including a gate electrode, a first electrode electrically connected to the D node, and a second electrode electrically connected to the gate electrode of the driving transistor, a fourth transistor including a gate electrode, a first electrode electrically connected to the gate electrode of the driving transistor, and a second electrode receiving a reference voltage, a fifth transistor including a gate electrode, a first electrode electrically connected to the gate electrode of the driving transistor, and a second electrode electrically connected to the N node, a sixth transistor including a gate electrode, a first electrode electrically connected to the first electrode of the driving transistor, and a second electrode receiving a driving low voltage, a seventh transistor including a gate electrode, a first electrode electrically connected to the second electrode of the driving transistor, and a second electrode receiving an initialization voltage, and an eighth transistor including a gate electrode, a first electrode electrically connected to the second electrode of the driving transistor, and a second electrode electrically connected to the first electrode of the light emitting diode.

The driving voltage may have a voltage value of a high level. The initialization voltage and the driving voltage may have substantially same value, or the initialization voltage may have a value of a high level corresponding to the value of driving voltage. The driving low voltage may have a value of a low level. The reference voltage may have a value of a high level.

The storage capacitor may store a voltage of the first electrode of the driving transistor. The hold capacitor may store the data voltage outputted from the second transistor.

The gate electrode of the second transistor may be electrically connected to a first scan line. The gate electrode of the fourth transistor and the gate electrode of the fifth transistor may be electrically connected to a second scan line. The gate electrode of the third transistor and the gate electrode of the sixth transistor may be electrically connected to a first light emitting control line. The gate electrode of the seventh transistor may be electrically connected to a third scan line. The gate electrode of the eighth transistor may be electrically connected to a second light emitting control line.

In an initializing period, the third transistor, the fourth transistor, the fifth transistor, and the sixth transistor may be turned on.

In a writing period, the second transistor, the fourth transistor, and the fifth transistor may be turned on.

In a compensating period, the fourth transistor, the fifth transistor, and the seventh transistor may be turned on.

The light emitting display device may further include a ninth transistor including a gate electrode, a first electrode electrically connected to the first electrode of the light emitting diode, and a second electrode to which the initialization voltage is applied. The gate electrode of the ninth transistor may be electrically connected to the third scan line, and in the compensating period, the ninth transistor may be turned on.

In a light emitting period, the third transistor, the sixth transistor, and the eighth transistor may be turned on.

An embodiment provides a light emitting display device that may include a metal layer disposed on a substrate, a buffer layer disposed on the metal layer, a semiconductor layer disposed on the buffer layer, a first gate insulating film disposed on the semiconductor layer, a first gate conductive layer disposed on the first gate insulating film, a second gate insulating film disposed on the first gate conductive layer, a second gate conductive layer disposed on the second gate insulating film, a first interlayer insulating film disposed on the second gate conductive layer, a first data conductive layer disposed on the first interlayer insulating film, a first organic film disposed on the first data conductive layer, a second data conductive layer disposed on the first organic film, and a second organic film disposed on the second data conductive layer. A first electrode of a hold capacitor disposed on the metal layer, a first node electrode disposed on the first gate conductive layer, and a first storage electrode of a storage capacitor disposed on the second gate conductive layer overlap in a plan view. The hold capacitor may be at a portion in which the first electrode of the hold capacitor and the first node electrode overlap in a plan view. The storage capacitor may be at a portion in which the first node electrode and the first storage electrode of the storage capacitor overlap in a plan view.

The semiconductor layer may include a semiconductor of a driving transistor, a semiconductor of a second transistor, a semiconductor of a third transistor, a semiconductor of a fourth transistor, a semiconductor of a fifth transistor, a semiconductor of a sixth transistor, a semiconductor of a seventh transistor, and a semiconductor of an eighth transistor. The first gate conductive layer may include a gate electrode of the driving transistor, a gate electrode of the second transistor, a gate electrode of the third transistor, a gate electrode of the fourth transistor, a gate electrode of the fifth transistor, a gate electrode of the sixth transistor, a gate electrode of the seventh transistor, and a gate electrode of the eighth transistor. The second data conductive layer may include a data line and a driving low voltage line.

The first data conductive layer may include a first connection member that may be electrically connected to the first storage electrode of the storage capacitor, to the semiconductor of the driving transistor, and to the semiconductor of the sixth transistor.

The first connection member may be disposed on the metal layer, and may be electrically connected to a first metal pattern overlapping at least a portion of the semiconductor of the driving transistor in a plan view.

The first data conductive layer may include a second connection member that is electrically connected to a first node connection member and to the first node electrode disposed on the second gate conductive layer. The second connection member may be electrically connected to the first node electrode through an opening disposed in the first storage electrode of the storage capacitor.

The first node connection member may be electrically connected to the semiconductor of the fifth transistor through a fifth connection member disposed on the first data conductive layer.

The first data conductive layer may include a fourth connection member that may be electrically connected to the gate electrode of the driving transistor, to the semiconductor of the third transistor, to the semiconductor of the fourth transistor, and to the semiconductor of the fifth transistor.

The first electrode of the hold capacitor may include a protruding connection portion that may be electrically connected to the semiconductor of the second transistor and to the semiconductor of the third transistor through a third connection member disposed on the first data conductive layer.

The metal layer may include a first scan line, a second scan line, a first light emitting control line, a third scan line, a second light emitting control line, a reference voltage line, an initialization voltage line, and a first driving low voltage line.

The first data conductive layer may include a (1-1)-th scan line, a (2-1)-th scan line, a (3-1)-th scan line, a (2-1)-th light emitting control line, a second reference voltage line, a second initialization voltage line, and a second driving low voltage line. The gate electrode of the second transistor may be electrically connected to the first scan line and the (1-1)-th scan line. The gate electrode of the third transistor and the gate electrode of the sixth transistor may be electrically connected to the first light emitting control line. The gate electrode of the fourth transistor and the gate electrode of the fifth transistor may be electrically connected to the second scan line and the (2-1)-th scan line. The gate electrode of the seventh transistor may be electrically connected to the third scan line and the (3-1)-th scan line. The gate electrode of the eighth transistor may be electrically connected to the second light emitting control line and the (2-1)-th light emitting control line.

The semiconductor layer may include a semiconductor of a ninth transistor. The first gate conductive layer may include a gate electrode of the ninth transistor. The gate electrode of the ninth transistor may be electrically connected to the third scan line and the (3-1)-th scan line.

According to the embodiments, it is possible to provide a pixel (an inverted pixel) in which a light emitting element is disposed at a driving voltage (ELVDD) side with respect to a driving transistor (opposed to the low voltage ELVSS side).

According to the embodiments, a display with inverted pixels may operate at a high speed driving frequency by separating a compensating period and a writing period and may have high resolution. In an inverted pixel, compensating performance may be improved by performing a compensating operation in conjunction with a source side of a driving transistor. When a data voltage is written in an inverted pixel, the data voltage is transmitted to the gate electrode of the driving transistor without passing through a capacitor and thus may be transmitted at a high transmission rate.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
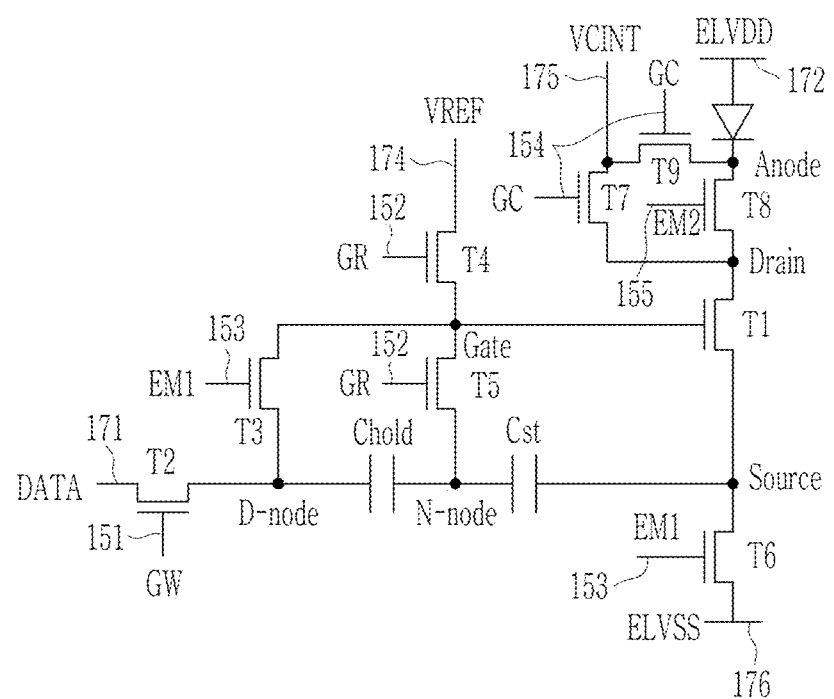
FIG. 1 illustrates a schematic diagram of an equivalent circuit of a pixel included in a light emitting display device according to an embodiment.

The disclosure will be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

In the drawings, the size and thickness of each element are arbitrarily illustrated for ease of description, and the disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, substrate, plate, or constituent element is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

Unless explicitly described to the contrary, the word "comprise" and variations such as "comprises" or "comprising" will be understood to imply the inclusion of stated elements but not the exclusion of any other elements.

Throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Throughout the specification, "connected" does not mean only when two or more elements are directly connected, but when two or more elements are indirectly connected through other elements, and when they are physically connected or electrically connected, and further, it may be referred to by different names depending on a position or function, and may also be referred to as a case in which respective parts that are substantially integrated are linked to each other.

It will be understood that the terms "connected to" or "coupled to" may include a physical or electrical connection or coupling.

Throughout the specification, when it is said that an element such as a wire, layer, film, region, area, substrate, plate, or constituent element "is extended (or extends) in a first direction or second direction," this does not mean only a straight shape extending straight in the corresponding direction, but may mean a structure that substantially extends in the first direction or the second direction, is partially bent, has a zigzag structure, or extends while having a curved structure.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The spatially relative terms "below," "beneath," "lower," "above," "upper," "upward," "downward," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device disposed "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Both an electronic device (for example, a mobile phone, a TV, a monitor, a laptop computer, etc.) including a display device, or a display panel described in the specification, and an electronic device including a display device and a display panel manufactured by a manufacturing method described in the specification, are not excluded from the scope of the specification.

Hereinafter, a circuit structure of a pixel of a light emitting display device according to an embodiment will be described with reference to FIG. 1.

FIG. 1 illustrates a schematic diagram of an equivalent circuit of a pixel included in a light emitting display device according to an embodiment. Any connection in FIG. 1 may include an electric connection as well as a physical connection.

A pixel according to the embodiment may include transistors T1, T2, T3, T4, T5, T6, T7, T8, and T9, a storage capacitor Cst, a hold capacitor Chold, and a light emitting diode, connected to wires 151, 152, 153, 154, 155, 171, 172, 174, 175, and 176. The transistors and the capacitors excluding the light emitting diode may form a pixel circuit part.

The wires 151, 152, 153, 154, 155, 171, 172, 174, 175, and 176 may be connected to a pixel PX. The wires may include a first scan line 151, a second scan line 152, a third scan line 154, a first light emitting control line 153, a second light emitting control line 155, a data line 171, a driving voltage line 172, a reference voltage line 174, an initialization voltage line 175, and a driving low voltage line 176.

The first scan line 151 may be connected to a scan driver (not shown) to transmit a first scan signal GW to the second transistor T2. The second scan line 152 may be connected to the scan driver (not shown) to transmit a second scan signal GR to the fourth transistor T4 and the fifth transistor T5, and the third scan line 154 may be connected to the scan driver (not shown) to transmit a third scan signal GC to the seventh transistor T7 and the ninth transistor T9. The first light emitting control line 153 may be connected to a light emitting signal generator (not shown) to transmit a first light emitting control signal EM1 to the third transistor T3 and the sixth transistor T6, and the second light emitting control line 155 may be connected to the light emitting signal generator (not shown) to transmit a second light emitting control signal EM2 to the eighth transistor T8. In some embodiments, the scan driver and the light emitting signal generator may be formed adjacent to each other, or may be formed as a single driver.

The data line 171 may transmit a data voltage DATA generated by a data driver (not shown), and accordingly, an amount of a current (hereinafter also referred to as a "light emitting current") flowing through the driving transistor T1 may be changed, and luminance of the light emitting diode may also change according to the amount of the corresponding current. The driving voltage line 172 may apply a driving voltage ELVDD, the reference voltage line 174 may apply a reference voltage VREF, the initialization voltage line 175 may apply an initialization voltage VCINT for initializing an anode (hereinafter also referred to as a first electrode), which may be one electrode of the light emitting diode, and the driving low voltage line 176 may apply a common voltage ELVSS. The initialization voltage VCINT and the driving voltage ELVDD may have the same voltage or the initialization voltage VCINT may have a voltage corresponding to the driving voltage ELVDD, and may have a high-level voltage value like the driving voltage ELVDD. The driving voltage ELVDD may be a voltage at which the driving transistor T1 operates in a compensation period so that a threshold voltage is compensated. In the embodiment, each of voltages applied to the driving voltage line 172, the reference voltage line 174, the initialization voltage line 175, and the driving low voltage line 176 may be a constant voltage.

Hereinafter, a connection relationship between respective transistors and capacitors will be described in detail.

The driving transistor T1 (also referred to as a first transistor) may be an n-type transistor, and an amount of the light emitting current flowing through the driving transistor T1 may be adjusted according to a voltage of a gate electrode (Gate) of the driving transistor T1 (a voltage stored in the hold capacitor Chold) during a light emitting period. An amount of a current flowing through the light emitting diode may be determined according to the amount of the light emitting current flowing through the driving transistor T1, and brightness of the light emitting diode may also be adjusted according to the amount of the current. Since the data voltage DATA applied to the pixel is stored in the hold capacitor Chold, the light emitting luminance of the light emitting diode may be adjusted according to the data voltage DATA. In the light emitting period, the light emitting diode and the driving transistor T1 may be connected between the driving voltage ELVDD and the driving low voltage ELVSS, and in the embodiment of FIG. 1, the light emitting diode may be disposed at the driving voltage ELVDD side, while the driving transistor T1 may be disposed at the driving low voltage ELVSS side. A source electrode (Source) (hereinafter, referred to as a first electrode) of the driving transistor T1 may be connected to a first electrode of the sixth transistor T6 (hereafter also referred to as a first light emitting transistor) and a first electrode of the storage capacitor Cst. A drain electrode (Drain) (hereafter referred to as a second electrode) of the driving transistor T1 may be connected to a first electrode of the seventh transistor (hereinafter also referred to as initialization voltage applying transistor) and a first electrode of the eighth transistor (hereinafter referred to as a second light emitting transistor). The gate electrode (Gate) of the driving transistor T1 may be connected to a second electrode of the third transistor T3 (also referred to as a gate voltage transmitting transistor), a first electrode of the fourth transistor T4 (also referred to as a first reference voltage transmitting transistor), and a first electrode of the fifth transistor T5 (also referred to as a second reference voltage transmitting transistor).

The second transistor T2 (hereinafter also referred to as a data voltage transmitting transistor) is an n-type transistor that receives the data voltage DATA into the pixel during a writing period. A gate electrode of the second transistor T2 may be connected to the first scan line 151, a first electrode of the second transistor T2 may be connected to the data line 171, and a second electrode of the second transistor T2 may be connected to a first electrode of the third transistor T3 and a first electrode of the hold capacitor Chold. The data voltage DATA transmitted into the pixel may be stored in the first electrode of the hold capacitor Chold. A terminal to which the second electrode of the second transistor T2, the first electrode of the third transistor T3, and the first electrode of the hold capacitor Chold may be connected is hereinafter referred to as a D-node (also referred to as a second node).

The third transistor T3 (gate voltage transmitting transistor) may be an n-type transistor, and it may transmit the data voltage DATA stored in the first electrode of the hold capacitor Chold to the gate electrode of the driving transistor T1 during the light emitting period to allow the driving transistor T1 to flow the light emitting current according to the corresponding voltage. A gate electrode of the third transistor T3 may be connected to the first light emitting control line 153, and a first electrode of the third transistor T3 may be connected to the second electrode of the second transistor T2 and the first electrode of the hold capacitor Chold. A second electrode of the third transistor T3 may be connected to the gate electrode (Gate) of the driving transistor T1, a first electrode of the fourth transistor T4, and a first electrode of the fifth transistor T5.

The fourth transistor T4 (first reference voltage transmitting transistor) is an n-type transistor, and serves to transmit the reference voltage VREF to the gate electrode (Gate) of the driving transistor T1 according to the second scan signal GR. A gate electrode of the fourth transistor T4 may be connected to the second scan line 152, and the first electrode of the fourth transistor T4 may be connected to the gate electrode (Gate) of the driving transistor T1, the second electrode of the third transistor T3, and the first electrode of the fifth transistor T5, and a second electrode of the fourth transistor T4 may be connected to the reference voltage line 174.

The fifth transistor T5 (second reference voltage transmitting transistor) may be an n-type transistor, and may transmit the reference voltage VREF transmitted from the fourth transistor T4 to an N-node (hereinafter also referred to as a first node) according to the second scan signal GR. A gate electrode of the fifth transistor T5 may be connected to the second scan line 152, the first electrode of the fifth transistor T5 may be connected to the gate electrode of the driving transistor T1, the second electrode of the third transistor T3, and the first electrode of the fourth transistor T4, and a second electrode of the fifth transistor T5 maybe connected to the N node to be connected to the second electrode of the hold capacitor Chold and the second electrode of the hold capacitor Cst.

The sixth transistor T6 (first light emitting transistor) may be an n-type transistor that connects the driving transistor T1 and the driving low voltage line 176 to which the driving low voltage ELVSS is applied in the light emitting period to allow an output current to flow through the driving transistor T1. A gate electrode of the sixth transistor T6 may be connected to the first light emitting control line 153, a first electrode of the seventh transistor T7 may be connected to the source electrode (Source) of the driving transistor T1 and the first electrode of the storage capacitor Cst. A second electrode of the seventh transistor T7 may be connected to the driving low voltage line 176.

The seventh transistor T7 (initialization voltage applying transistor) may be an n-type transistor, and may transmit the initialization voltage VCINT so that the driving transistor T1 may operate during the compensating period. A gate electrode of the seventh transistor T7 may be connected to the third scan line 154, and the first electrode of the seventh transistor T7 may be connected to the drain electrode (Drain) of the driving transistor T1 and a first electrode of the eighth transistor T8. The second electrode of the seventh transistor T7 may be connected to the initialization voltage line 175.

The eighth transistor T8 (second light emitting transistor) may be an n-type transistor, and may form a current path between the driving voltage ELVDD and the driving low voltage ELVSS to allow an output current to flow through the driving transistor T1 together with the sixth transistor T6 in the light emitting period. A gate electrode of the eighth transistor T8 may be connected to the second light emitting control line 155, the first electrode of the eighth transistor T8 may be connected to the drain electrode (Drain) of the driving transistor T1 and the first electrode of the seventh transistor T7, and a second electrode of the eighth transistor T8 may be connected to the anode (Anode) of the light emitting diode and the first electrode of the ninth transistor T9.

The ninth transistor T9 (anode initialization transistor) may be an n-type transistor, and serves to initialize the anode (Anode) of the light emitting diode to the initialization voltage VCINT. Hereinafter, a gate electrode of the ninth transistor T9 may be connected to the third scan line 154, a first electrode of the ninth transistor T9 may be connected to the anode (Anode) of the light emitting diode, and a second electrode of the ninth transistor T9 may be connected to the initialization voltage line 175.

The light emitting diode may include the anode (Anode) (first electrode) connected to the second electrode of the eighth transistor T8 and the first electrode of the ninth transistor T9, and the cathode (hereinafter referred to as the second electrode) to which the driving voltage ELVDD is directly applied.

As described above, the transistors T1, T2, T3, T4, T5, T6, T7, T8, and T9 may all be formed as the n-type transistor, and may be turned on when a high voltage is applied to the gate electrode thereof. In some embodiments, the transistors T1, T2, T3, T4, T5, T6, T7, T8, and T9 may include a polycrystalline semiconductor or an oxide semiconductor as a semiconductor layer. The names of the source electrode, the drain electrode, the first electrode, and the second electrode of the transistor, and the anode and the cathode of the light emitting diode may be changed depending on the polarity of the components.

The hold capacitor Chold may be disposed between the D node (D-node) and the N-node (N-node), and the storage capacitor Cst may be disposed between the N node (N-node) and the source electrode (Source) of the driving transistor T1.

The first electrode of the hold capacitor Chold may be connected to the second electrode of the second transistor T2 and the first electrode of the third transistor T3 through the D node (D-node), and the second electrode of the hold capacitor Chold may be connected to the second electrode of the fifth transistor T5 and the second electrode of the storage capacitor Cst through the N node (N-node). The N node (N-node) may be maintained at the reference voltage VREF except for the light emitting period, and when the data voltage DATA is applied, it is transmitted to the first electrode of the hold capacitor Chold and stored in the hold capacitor Chold. The hold capacitor Chold may store the data voltage DATA.

The first electrode of the storage capacitor Cst may be connected to the source electrode (Source) of the driving transistor T1 and the first electrode of the sixth transistor T6, and the second electrode of the storage capacitor Cst may be connected to the second electrode of the fifth transistor T5 and the second electrode of the hold capacitor Chold through the N node (N-node). The N node (N-node) may be maintained at the reference voltage VREF except for the light emitting period, and when the voltage of the source electrode (Source) of the driving transistor T1 is determined, the voltage is stored in the first electrode of the storage capacitor Cst and may prevent the voltage of the source electrode (Source) of the driving transistor T1 from being easily changed.

In some embodiments, the names of the hold capacitor Chold and the storage capacitor Cst may be interchangeable from what they are called in FIG. 1.

In FIG. 1, the light emitting diode may be disposed between the second electrode of the eighth transistor T8 and the driving voltage line 172. Since the light emitting diode may be disposed between the driving transistor T1 and the driving voltage ELVDD, in order to distinguish the circuit of the embodiment from a circuit where the light emitting diode of the pixel is disposed between the driving transistor T1 and the driving low voltage ELVSS, the pixel of the embodiment may be referred to as an inverted pixel. The light emitting diode may emit luminance according to the amount of the current flowing through the current path formed from the driving voltage ELVDD to the driving low voltage ELVSS through the driving transistor T1, and the greater the current, the higher the displayed luminance.

In the embodiment of FIG. 1, it has been described that a pixel PX includes nine transistors T1 to T9 and two capacitors (the hold capacitor Chold and the storage capacitor Cst), but the disclosure is not limited thereto, and in some embodiments, additional capacitors or transistors may be included, and some capacitors or transistors may be omitted.

The circuit structure of the pixel formed in the display area DA has been described with reference to FIG. 1.

Figure 2:
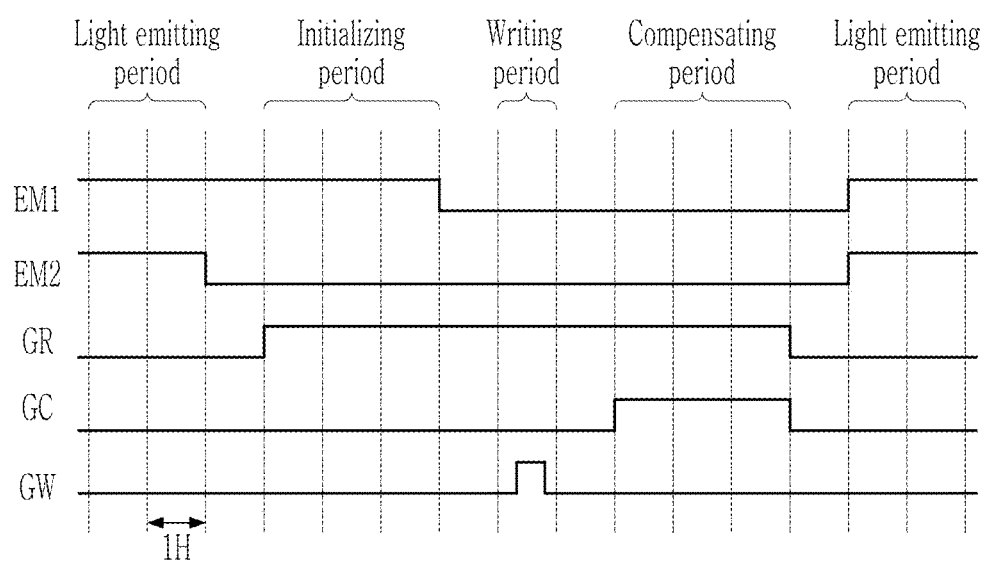
FIG. 2 illustrates a waveform diagram of a signal applied to the pixel of FIG. 1.

Hereinafter, an operation of the pixel when a waveform signal of FIG. 2 is applied to the pixel of FIG. 1 will be described with reference to FIG. 3 to FIG. 6.

FIG. 2 illustrates a waveform diagram of a signal applied to the pixel of FIG. 1, and FIG. 3 to FIG. 6 illustrate operations of respective periods of the waveform diagram of FIG. 2. Any connection illustrated in FIG. 3 to FIG. 6 may include an electric connection as well as a physical connection.

Referring to FIG. 2, when a signal applied to a pixel is divided into periods, it may be divided into an initializing period, a writing period, a compensating period, and a light emitting period. When the light emitting period ends, the periods from the initializing period are repeated.

The light emitting period may be a period in which the light emitting diode emits light, and may be a period in which the first light emitting signal EM1 and the second light emitting signal EM2 of a gate-on voltage (high level voltage) are applied to form a current path. The sixth transistor T6 and the eighth transistor T8 may be respectively turned on by the first light emitting signal EM1 and the second light emitting signal EM2, so that the current path configured of the driving voltage ELVDD, the light emitting diode, the driving transistor T1, and the driving low voltage ELVSS may be formed, and the current flowing through the driving transistor T1 may also flow through the light emitting diode. The current flowing through the driving transistor T1 may be determined by the voltage of the gate electrode (Gate) of the driving transistor T1, and during the light emitting period, the third transistor T3 may be turned on by the first light emitting signal EM1 and the data voltage DATA stored in the first electrode of the hold capacitor Chold is applied to the gate electrode (Gate) of the driving transistor T1, so that the amount of the current flowing through the driving transistor T1 may be determined according to the corresponding data voltage DATA, and accordingly, the luminance of the light emitted by the light emitting diode may also be determined.

Referring to FIG. 2, after the second light emitting signal EM2 may be changed to a gate-off voltage (a low level voltage), the initialization period may be entered while the second scan signal GR of the gate-on voltage (high level voltage) is applied. The first light emitting signal EM1 may continuously maintain the gate-on voltage (high level voltage).

Figure 3:
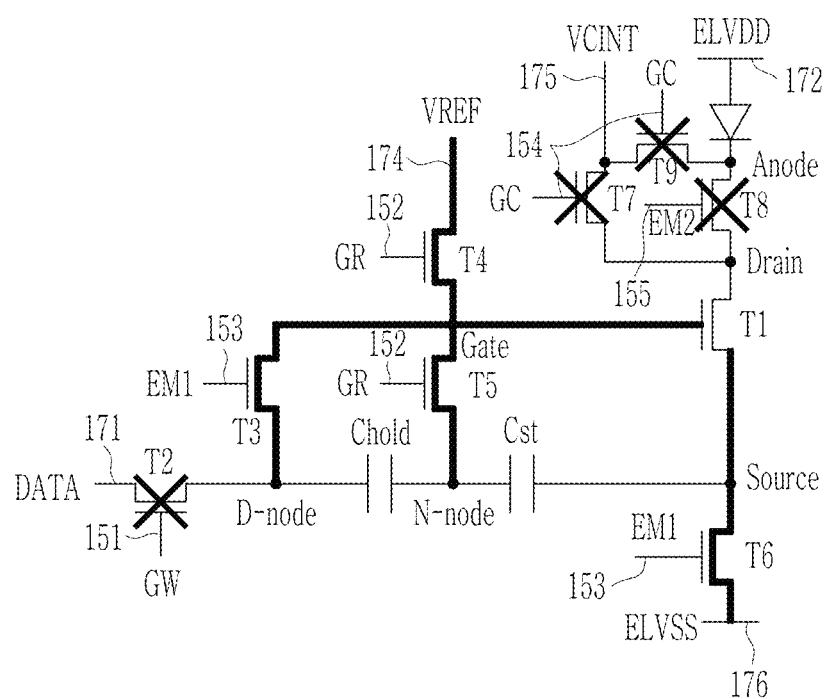
FIG. 3 to FIG. 6 illustrate operations of respective sections of the waveform diagram of FIG. 2.

An operation of the pixel in the initializing period is illustrated in FIG. 3.

Referring to FIG. 3, the second light emitting signal EM2 may be changed to the gate-off voltage (low level voltage) and thus the eighth transistor T8 may be turned off, but due to the second scan signal GR and the first light emitting signal EM1 of the gate-on voltage (high level voltage), the fourth transistor T4, the fifth transistor T5, the third transistor T3, and the sixth transistor T6 may be turned on. In FIG. 3, the path connected by the turned-on transistors is indicated by a thick line, and the turned-off transistors are indicated by the letters 'X.'

In the initializing period, as the fourth transistor T4, the fifth transistor T5, and the third transistor T3 may be turned on, the reference voltage VREF may be applied to the gate electrode (Gate) of the driving transistor T1, the D node (D-node), and the N node (N-node), so that each electrode and each node may be initialized. The reference voltage VREF may have a high voltage (a high level voltage) capable of turning on the driving transistor T1. Although the sixth transistor T6 is turned on, all transistors are turned off at the drain electrode of the driving transistor T1, so a current path may not be formed, and only the voltage of the source electrode (Source) of the driving transistor T1 may be initialized to the driving low voltage ELVSS. The voltage (driving low voltage ELVSS) of the source electrode (Source) of the driving transistor T1 may be stored in the first electrode of the storage capacitor Cst to be maintained.

Referring to FIG. 2, after the first light emitting signal EM1 may be changed to the gate-off voltage (low level voltage), the writing period may be entered while the first scan signal GW of the gate-on voltage (high level voltage) is applied. The second scan signal GR may continuously maintain the gate-on voltage (high level voltage).

Figure 4:
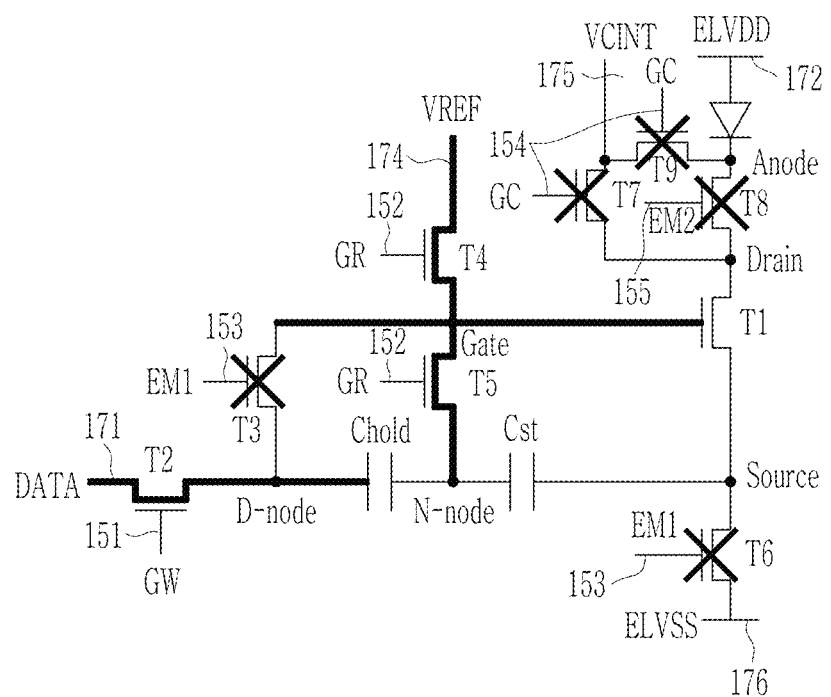

An operation of the pixel in the writing period is illustrated in FIG. 4.

Referring to FIG. 4, the first light emitting signal EM1 may be changed to the gate-off voltage (voltage of a low level) and thus the third transistor T3 and the sixth transistor T6 may be turned off, but the second transistor T2, the fourth transistor T4, and the fifth transistor T5 may be turned on due to the first scan signal GW and the second scan signal GR of the gate-on voltage (high level voltage). In FIG. 4, the path connected by the turned-on transistors is indicated by a thick line, and the turned-off transistors are indicated by the letters 'X.'

In the writing period, the N node (N-node) and the gate electrode (Gate) of the driving transistor T1 may be maintained at the reference voltage VREF by the fourth transistor T4 and the fifth transistor T5, but the data voltage DATA may be transmitted to the D node (D-node) through the second transistor T2 to be transmitted to and stored in the first electrode of the hold capacitor Chold. The driving low voltage ELVSS transmitted to the first electrode of the storage capacitor Cst may be maintained during the initializing period, so that the voltage of the source electrode (Source) of the driving transistor T1 may have the driving low voltage ELVSS. Since all transistors disposed at respective ends of the driving transistor T1 may be turned off, no current path is formed.

Referring to FIG. 2, after the first scan signal GW may be changed to the gate-off voltage (low level voltage), the compensating period may be entered while the third scan signal GC of the gate-on voltage (high level voltage) may be applied. The second scan signal GR may continuously maintain the gate-on voltage (high level voltage).

Figure 5:
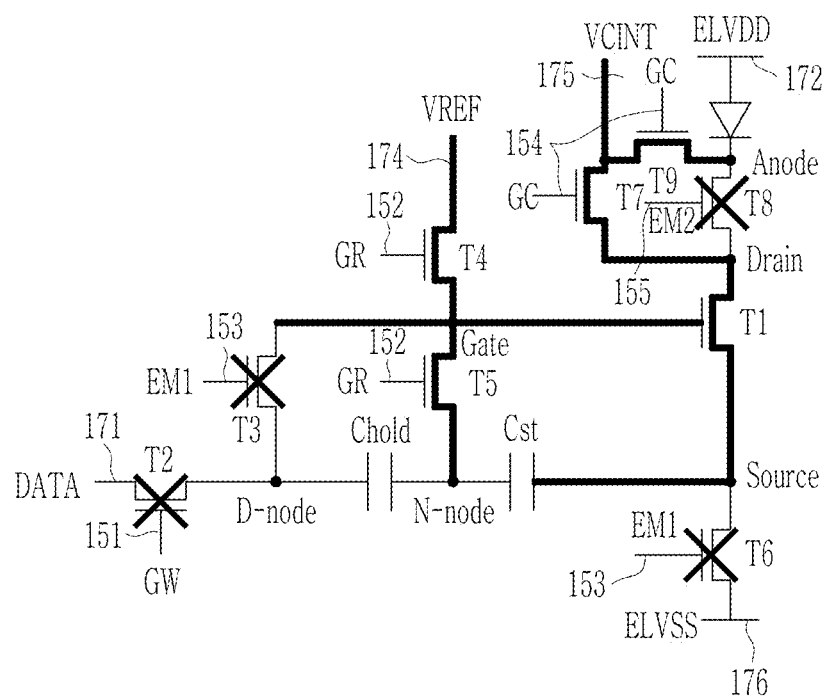

An operation of the pixel in the compensating period is illustrated in FIG. 5.

Referring to FIG. 5, the first scan signal GW may be changed to the gate-off voltage (low level voltage) and thus the second transistor T2 is turned off, but due to the second scan signal GR and the third scan signal GC of the gate-on voltage (high level voltage), the fourth transistor T4, the fifth transistor T5, the seventh transistor T7, and the ninth transistor T9 may be turned on. In FIG. 5, the path connected by the turned-on transistors is indicated by a thick line, and the turned-off transistors are indicated by the letters 'X.'

In the compensating period, the N node (N-node) and the gate electrode (Gate) of the driving transistor T1 may be maintained at the reference voltage VREF by the fourth transistor T4 and the fifth transistor T5, and the seventh transistor T7 connected to the drain electrode of the driving transistor T1 may be turned on, so that the initialization voltage VCINT is transmitted to the drain electrode of the driving transistor T1. The initialization voltage VCINT and the driving voltage ELVDD may have a same voltage, or the initialization voltage VCINT may have a voltage that corresponds to the driving voltage ELVDD. Since the reference voltage VREF of a high voltage may be applied to the gate electrode (Gate) of the driving transistor T1, the driving transistor T1 may output a current to the source electrode (Source) of the driving transistor T1. The current outputted from the driving transistor T1 may be transmitted to the first electrode of the storage capacitor Cst to gradually change the voltage of the first electrode of the storage capacitor Cst from the driving low voltage ELVSS to a high voltage value. When the voltage of the first electrode of the storage capacitor Cst, for example, the voltage of the source electrode (Source) of the driving transistor T1, reaches a voltage that is lower than the voltage of the gate electrode (Gate) of the driving transistor T1 by a threshold voltage Vth of the driving transistor T1, the driving transistor T1 may be turned off to no longer output a current. Accordingly, when the compensating period ends, the voltage of the first electrode of the storage capacitor Cst is lower than the voltage of the gate electrode (Gate) of the driving transistor T1 by the threshold voltage Vth of the driving transistor T1. Since the voltage of the gate electrode (Gate) of the driving transistor T1 is maintained as the reference voltage VREF by the fourth transistor T4, after the compensating period ends, the voltage of the source electrode (Source) of the driving transistor T1 may be as Equation 1 below.

$$V_{source} = V(VREF) - V(Vth) \quad \text{[Equation 1]}$$

Vsource represents a voltage value of the source electrode (Source) of the driving transistor T1, V(VREF) represents a voltage value of the reference voltage VREF, and V(Vth) represents a voltage value of the threshold voltage Vth of the driving transistor T1. Respective driving transistors T1 may have different threshold voltages Vth. The voltage of the source electrode (Source) of the driving transistor T1 determined as described above is stored in and maintained at the first electrode of the storage capacitor Cst.

In the compensating period, the ninth transistor T9 may also be turned on due to the third scan signal GC, so that the initialization voltage VCINT is applied to the anode (Anode) of the light emitting diode to initialize the anode (Anode). The initialization voltage VCINT and the driving voltage ELVDD may have a same voltage, or the initialization voltage VCINT may have a voltage that corresponds to the driving voltage ELVDD, so that no current flows through the light emitting diode and thus the light emitting diode may not emit light.

Referring to FIG. 2, after the second scan signal GR and the third scan signal GC may be changed to the gate-off voltage (low level voltage), the first light emitting signal EM1 and the second light emitting signal EM2 may be applied as the gate-on voltage (high level voltage) to enter the light emitting period.

Figure 6:
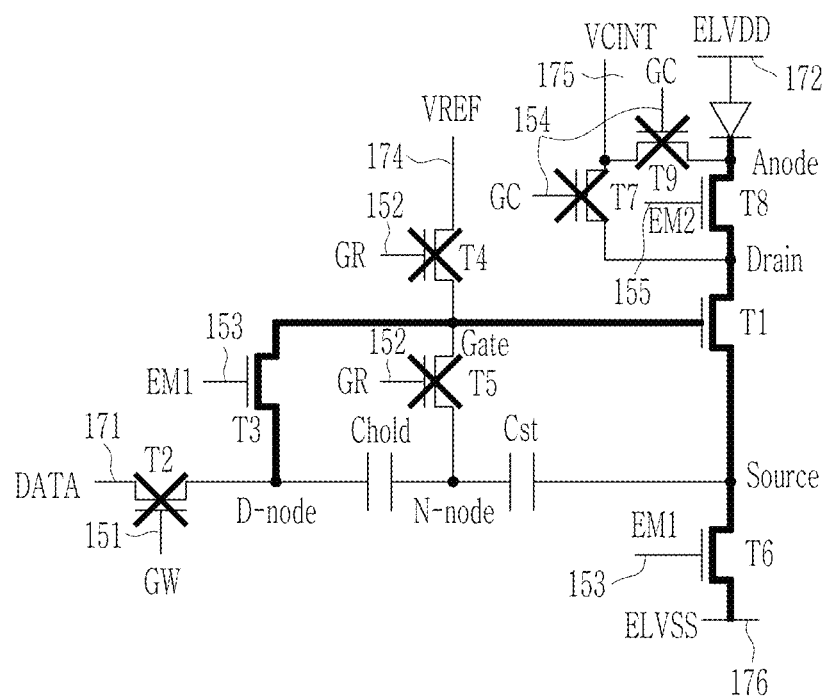

An operation of the pixel in the light emitting period is illustrated in FIG. 6.

Referring to FIG. 6, the second scan signal GR and the third scan signal GC may be changed to the gate-off voltage (low level voltage), so that the fourth transistor T4, the fifth transistor T5, the seventh transistor T7, and the ninth transistor T9 may be turned off, but due to the first light emitting signal EM1 and the second light emitting signal EM2 of the gate-on voltage (high level voltage), the third transistor T3, the sixth transistor T6, and the eighth transistor T8 may be turned on. In FIG. 6, the path connected by the turned-on transistors is indicated by a thick line, and the turned-off transistors are indicated by the letters 'X.'

In the light emitting period, the sixth transistor T6 and the eighth transistor T8 may be respectively turned on to form a current path from the driving voltage ELVDD, the light emitting diode, the driving transistor T1, to the driving low voltage ELVSS, and the third transistor T3 may be turned on, so that the voltage of the gate electrode (Gate) of the driving transistor T1 may have the data voltage DATA stored in the first electrode of the hold capacitor Chold. As a result, the amount of the current flowing through the driving transistor T1 is determined according to the data voltage DATA applied to the gate electrode (Gate) of the driving transistor T1, and accordingly, the corresponding current may flow through the current path, and the light emitting diode may emit light according to the corresponding current. The light emitting operation may continue until the second light emitting signal EM2 changes to the low voltage.

Hereinafter, the amount of the current outputted from the driving transistor T1 will be described in more detail.

The amount of the current outputted from the driving transistor T1 is as Equation 2 below.

$$Ids = k^* \{V(Vg) - V(Vs) - V(Vth)\}^{-2} \quad \text{[Equation 2]}$$

Ids represents an amount of the current outputted to the source electrode (Source) of the driving transistor T1, k is a constant value according to the characteristics of the driving transistor T1, V(Vg) represents a voltage value of the gate electrode (Gate) of the driving transistor T1, V(Vs) represents a voltage value of the source electrode (Source) of the driving transistor T1, and V(Vth) represents a voltage value of the threshold voltage Vth of the driving transistor T1.

The voltage of the source electrode (Source) of the driving transistor T1 in the light emitting period may have the voltage value of Equation 1 stored in the compensating period. The voltage of the source electrode (Source) of the driving transistor T1 may be lower than the voltage of the gate electrode (Gate) of the driving transistor T1 by the threshold voltage Vth of the driving transistor T1. In the light emitting period, the voltage of the gate electrode (Gate) of the driving transistor T1 may have a data voltage DATA value by the third transistor.

Equation 3 substitutes the voltage values of the source electrode (Source) and the gate electrode (Gate) of the driving transistor T1 in the light emitting period into Equation 2, as shown below.

$$\begin{aligned} Ids &= k^* \{V(DATA) - (V(VREF) - V(Vth)) - V(Vth)\}^{-2} \quad \text{[Equation 3]} \\ &= k^* \{V(DATA) - V(VREF) + V(Vth) - V(Vth)\}^{-2} \\ &= k^* \{V(DATA) - V(VREF)\}^{-2} \end{aligned}$$

Ids represents an amount of the current outputted to the source electrode (Source) of the driving transistor T1, k is a constant value according to the characteristics of the driving transistor T1, V(DATA) represents a voltage value of the data voltage, V(VREF) represents a voltage value of the reference voltage VREF, and V(Vth) represents a voltage value of the threshold voltage Vth of the driving transistor T1.

According to Equation 3, the amount of the current outputted to the source electrode (Source) of the driving transistor T1 may be determined according to the values of the data voltage DATA and the reference voltage VREF. Since the value of the reference voltage VREF may have a constant voltage, the amount of the output current of the driving transistor T1 may be determined according to the data voltage DATA. According to Equation 3, since the output current of the driving transistor T1 is independent of the threshold voltage Vth of the driving transistor T1, although the threshold voltage Vth may be different for each driving transistor T1 or the threshold voltage Vth may change after the transistor T1 is used for a long period of time, the driving transistor T1 may output a constant output current according to the data voltage DATA.

The variations of voltage and current according to the operation of the pixel as described above are illustrated in FIG. 7.

Figure 7:
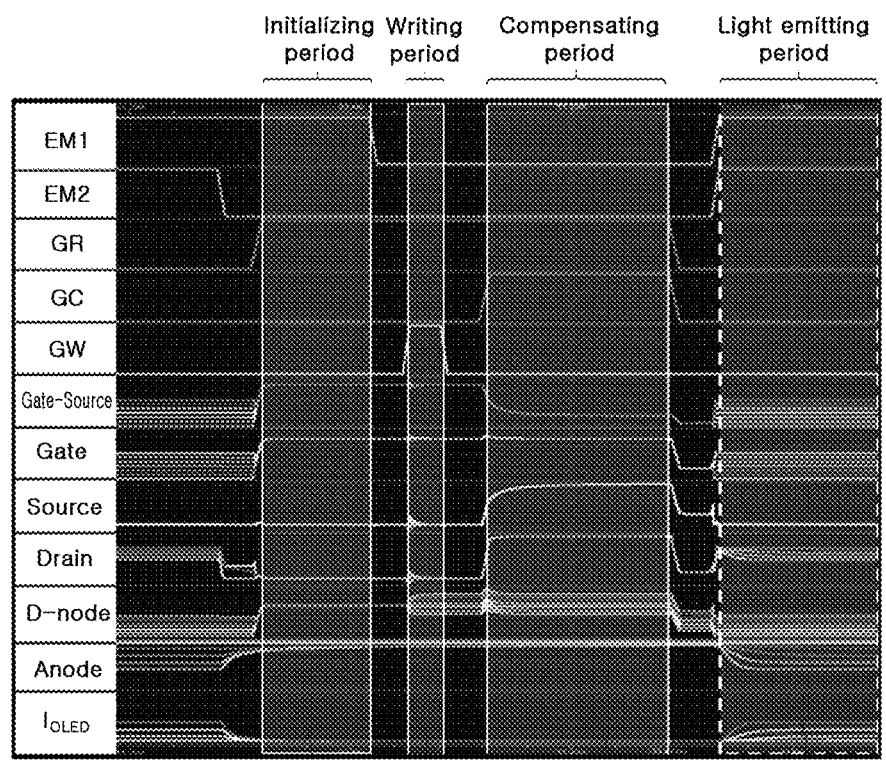
FIG. 7 illustrates a graph simulating voltage and current variations in the pixel according to FIG. 1 and FIG. 2.

FIG. 7 illustrates a simulation of voltage and current variations in the pixel according to FIG. 1 and FIG. 2.

In FIG. 7, EM1 represents a first light emitting control signal, EM2 represents a second light emitting control signal, GR represents a second scan signal, GC represents a third scan signal, and GW represents a first scan signal. In FIG. 7, Gate-Source is a value obtained by subtracting a voltage of the source electrode (Source) from a voltage of the gate electrode (Gate) of the driving transistor T1, Gate represents a voltage of the gate electrode of the driving transistor T1, Source represents a voltage of the source electrode of the driving transistor T1, Drain represents a voltage of the drain electrode of the driving transistor T1, D-node represents a voltage of the D node, and Anode represents a voltage of the anode of the light emitting diode. In FIG. 7, IOLED represents a current flowing through the light emitting diode, for example, an output current of the driving transistor T1, as a current flowing through the current path in the light emitting period.

The changes of voltages in respective periods are as described above.

Referring to FIG. 2, the initializing period and the compensating period may each have a period of 3H, and the writing period may be disposed in any period of the period of 3H. In FIG. 2, the writing period is formed in a middle of the period of 3H, but it may be disposed in the first H or third H period of the writing period of 3H according to the position of the pixel and/or embodiments. In some embodiments, the sizes of the initializing period, the writing period, and the compensating period may be changed to a different value from 3H.

In the embodiment of FIG. 2, the compensating period and the writing period may be separated. As the compensating period and the writing period are separated, the writing operation may be quickly performed while compensation is sufficiently performed for the period of 3H, thus the writing operation may be performed at a high speed driving frequency, and accordingly, the entire light emitting display device may operate at the high speed driving frequency. The high speed driving frequency may allow more data to be written in a selected time, and it is a suitable driving method for high resolution light emitting display devices.

According to FIG. 1 and FIG. 2, in the inverted pixel, the threshold voltage value may be included in the voltage of the source electrode (Source) of the driving transistor while the voltage of the source electrode (Source) of the driving transistor is stored, so that the driving transistor T1 may finally generate an output current regardless of the threshold voltage. As described above, in the embodiment of FIG. 1 and FIG. 2, a compensation operation for removing the characteristic of the threshold voltage Vth may be performed by using the voltage of the source electrode (Source) of the driving transistor T1 in the inverted pixel.

In the pixel of FIG. 1, the data voltage DATA may be directly transmitted to the gate electrode (Gate) of the driving transistor T1 through the third transistor T3. Accordingly, the data voltage DATA may not be transmitted to the gate electrode Gate of the driving transistor T1 via the capacitor, so that the output current of the driving transistor T1 may be directly changed due to the change in the data voltage DATA.

In the above, the circuit structure and operation of the pixel have been described.

Hereinafter, a planar structure and a cross-sectional structure of a pixel circuit part of a pixel according to an embodiment will be described in detail with reference to FIG. 8 to FIG. 17. Any connection illustrated in FIG. 8 to FIG. 17 may include an electric connection as well as a physical connection.

Figure 14:
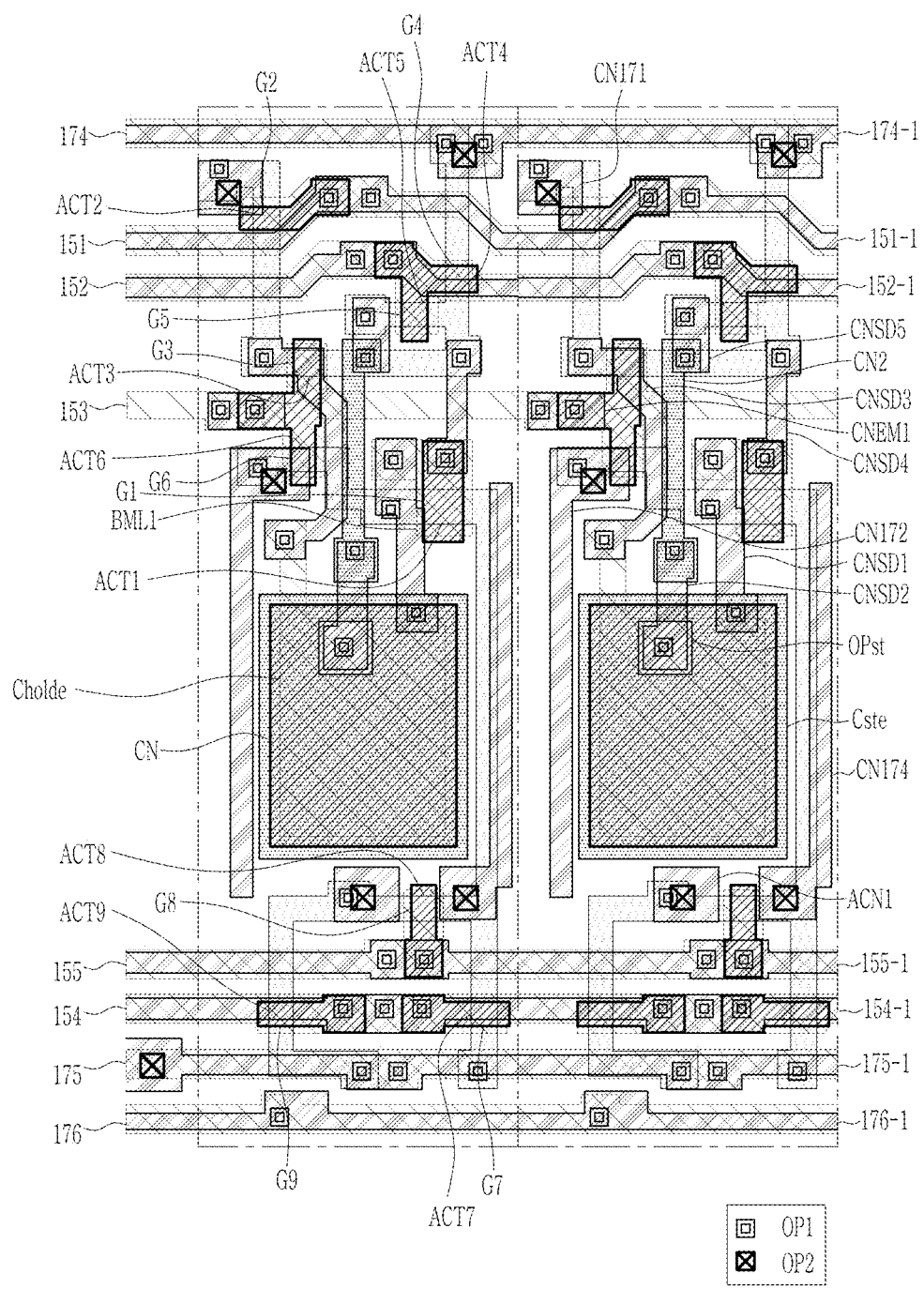
Figure 15:
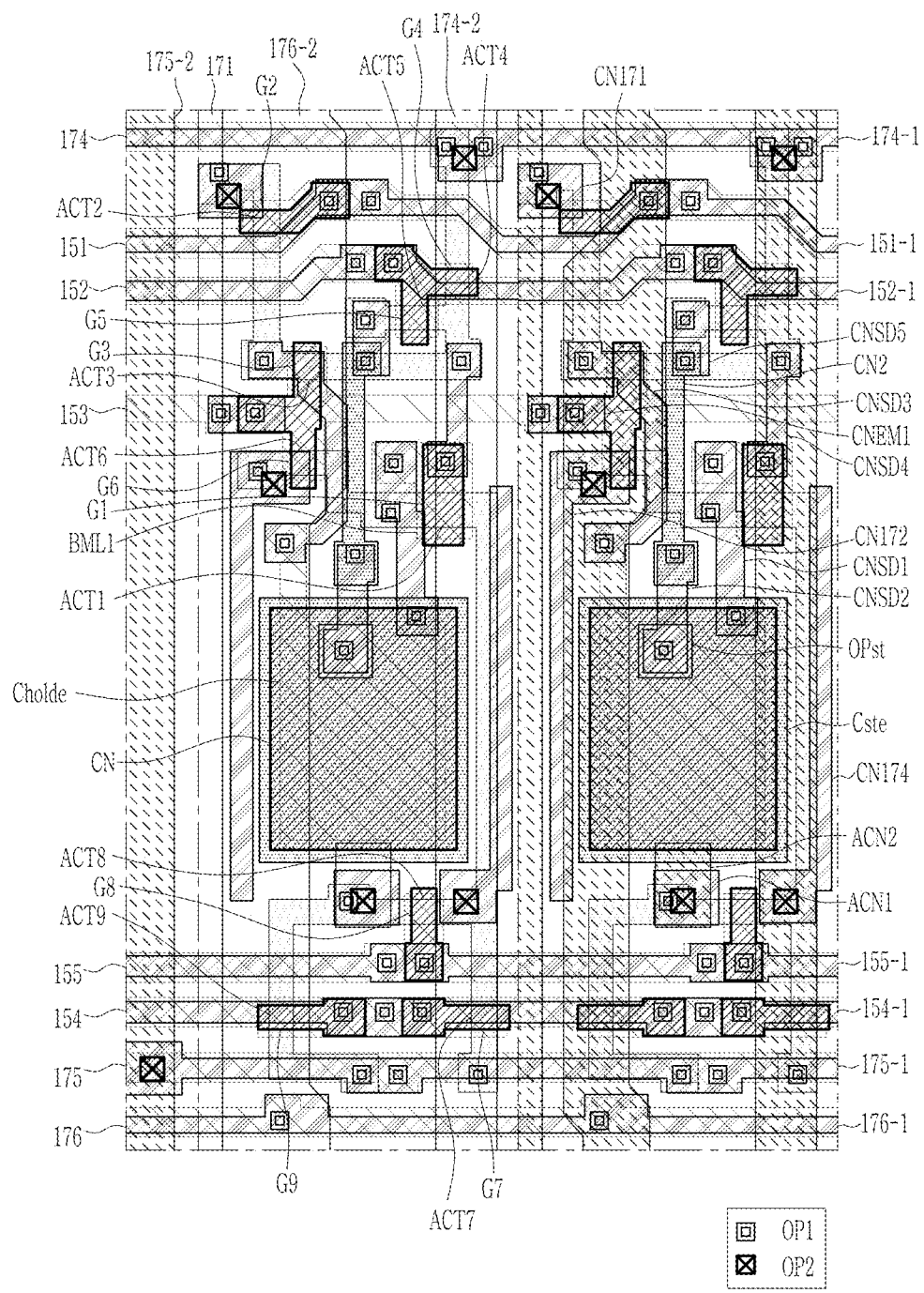
Figure 16:
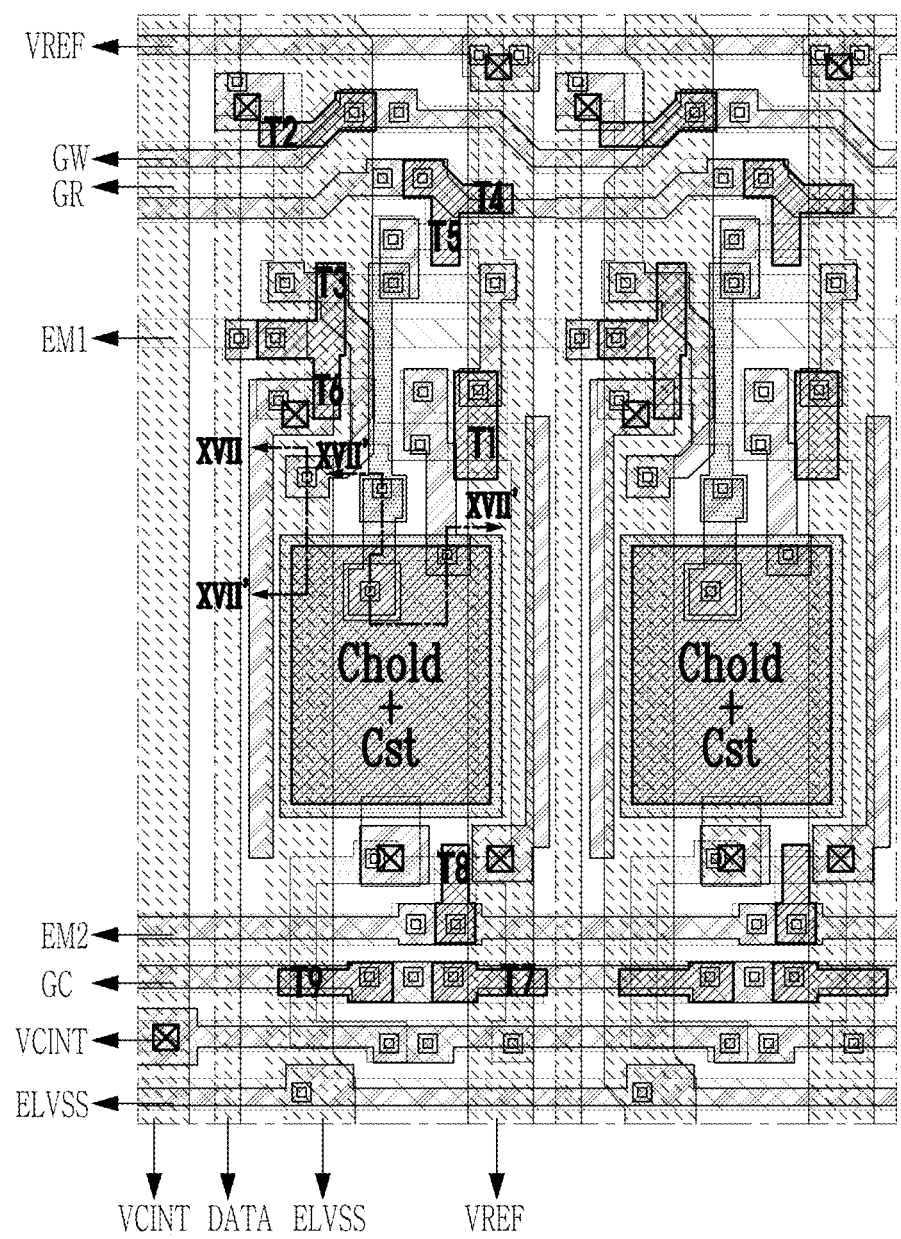
Figure 17:
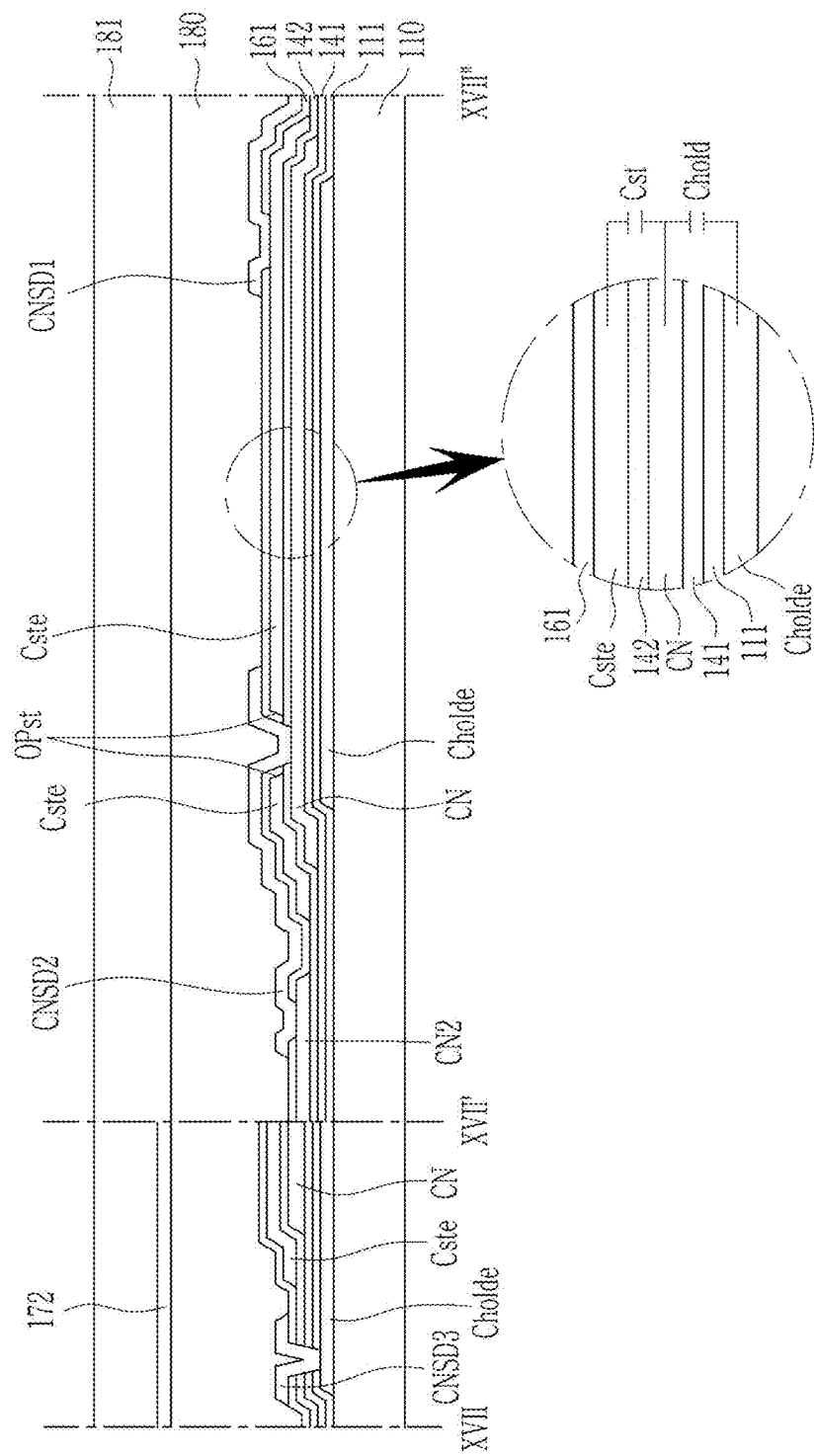
FIG. 17 illustrates a schematic cross-sectional view taken along lines XVII-XVII' and XVII'-XVII" of FIG. 16.

FIG. 8 to FIG. 16 illustrate schematic plan views of respective layers according to a manufacturing sequence of a light emitting display device according to an embodiment, and FIG. 17 illustrates a cross-sectional view taken along lines XVII-XVII' and XVII'-XVII" of FIG. 16.

Figure 8:
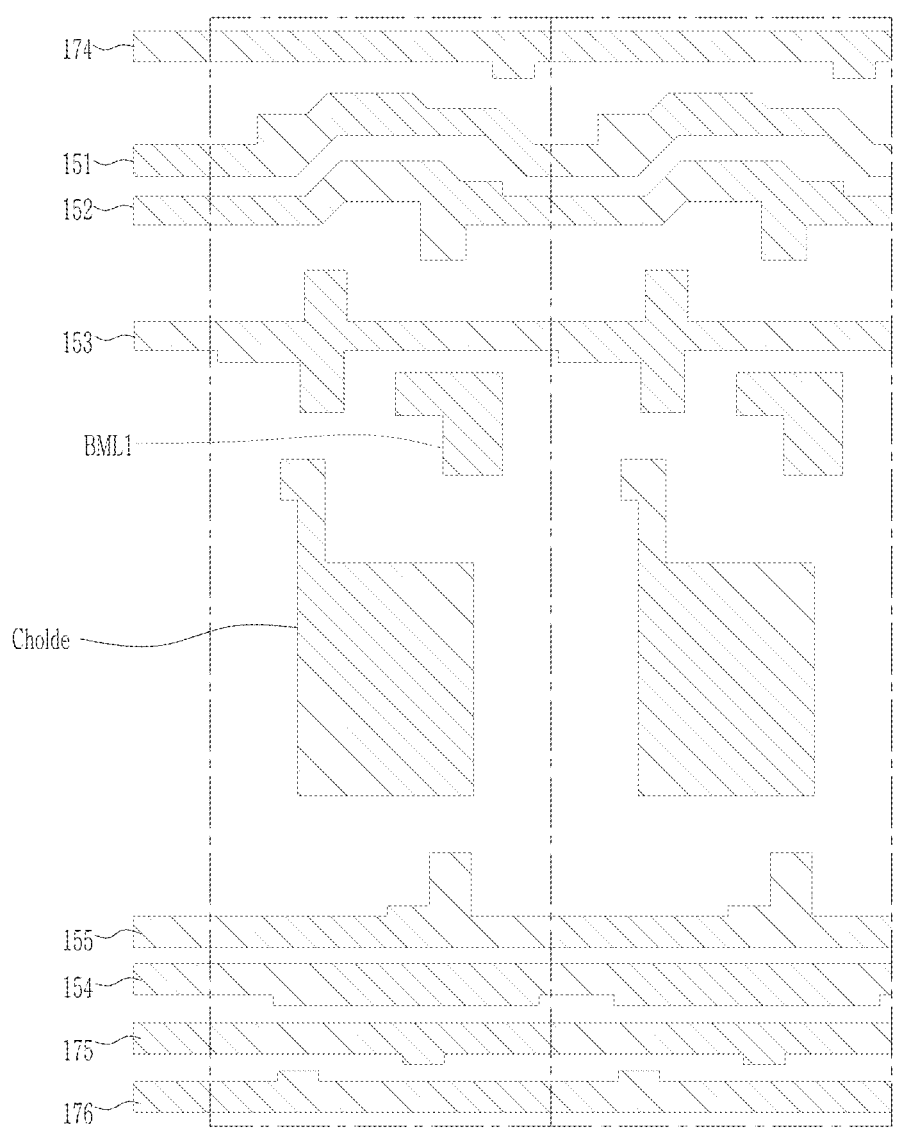
FIG. 8 to FIG. 16 illustrate schematic plan views of respective layers according to a manufacturing sequence of a light emitting display device according to an embodiment.

Referring to FIG. 8 and FIG. 17, a metal layer is disposed on a substrate 110.

The substrate 110 may include a material that has a rigid characteristic such as glass and thus is not bent, or may include a flexible material such as plastic or polyimide that may be bent. In a case of a flexible substrate, the substrate 110 may have a structure in which a two-layered structure of polyimide and a barrier layer formed of an inorganic insulating material thereon are stacked multiple times.

The metal layer may include the first scan line 151, the second scan line 152, the first light emitting control line 153, the third scan line 154, the second light emitting control line 155, the reference voltage line 174, the initialization voltage line 175, the first driving low voltage line 176, a first metal pattern BML1, and a first electrode Cholde of the hold capacitor Chold.

The first scan line 151, the second scan line 152, the first light emitting control line 153, the third scan line 154, the second light emitting control line 155, the reference voltage line 174, the initialization voltage line 175, and the first driving low voltage line 176 may extend in a horizontal direction (first direction), and may have at least one protrusion or extension. In FIG. 8, the first scan line 151 and the second scan line 152 may have a bent structure, the first scan line 151 may have an upward extension, and the second scan line 152 may have a downward protrusion. The first light emitting control line 153 may have a vertically protrusion, the third scan line 154 may have a downward extension, and the second light emitting control line 155 may have an upward protrusion. The reference voltage line 174 may have a downward extension, the initialization voltage line 175 may have a downward extension, and the first driving low voltage line 176 may have an upward extension.

The first metal pattern BML1 may have a bent structure and may be disposed below the first light emitting control line 153, and the first electrode Cholde of the hold capacitor Chold may be disposed below the first metal pattern BML1. The first electrode Cholde of the hold capacitor Chold may further include a protruding connection portion.

The metal layer may also be referred to as a lower shielding layer, and may contain a metal such as copper (Cu), molybdenum (Mo), aluminum (Al), and titanium (Ti), or a metal alloy thereof, and may be formed as a single layer or multilayer.

Referring to FIG. 17, a buffer layer 111 may be disposed on the substrate 110 and the metal layer, and may cover the substrate 110 and the metal layer. The buffer layer 111 may block impurities from penetrating into a semiconductor layer disposed on it, and may be an inorganic insulating layer including a silicon oxide (SiOx), a silicon nitride (SiNx), or a silicon oxynitride (SiONx).

Figure 9:
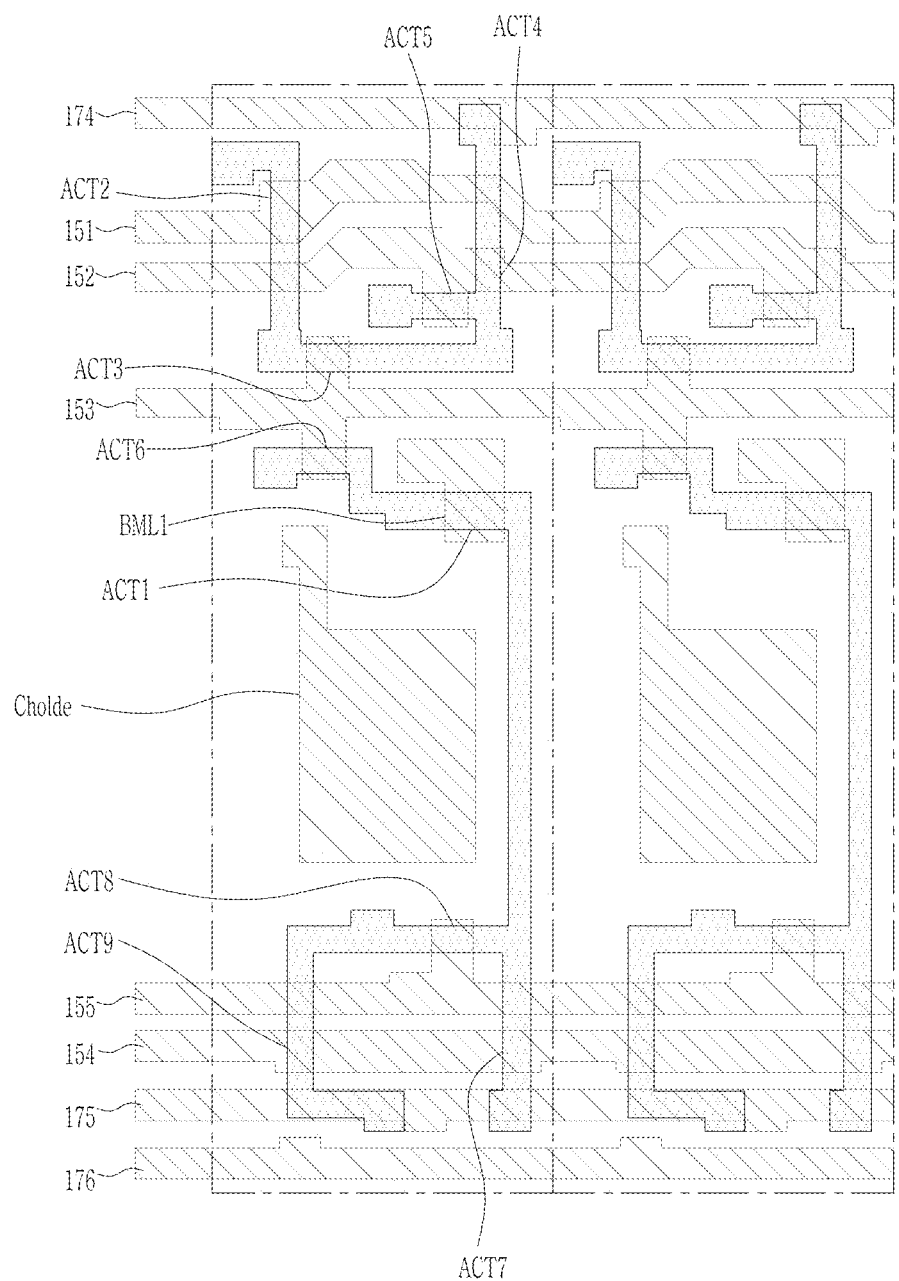

A semiconductor layer may be disposed on the buffer layer 111 as shown in FIG. 9. The semiconductor layer may include a channel, a first region, and a second region of the transistors T1, T2, T3, T4, T5, T6, T7, T8, and T9. The first region and the second region disposed at respective sides of the channel except for the channel of the semiconductor layer may have the same or equivalent characteristics as a conductive layer by plasma treatment or doping. The semiconductor layer may include a polycrystalline semiconductor or an oxide semiconductor.

The semiconductor layer may be largely divided into two portions (a first semiconductor portion and a second semiconductor portion), and the first semiconductor portion may include a semiconductor ACT1 of the driving transistor T1, a semiconductor ACT6 of the sixth transistor T6, a semiconductor ACT7 of the seventh transistor T7, a semiconductor ACT8 of the eighth transistor T8, and a semiconductor ACT9 of the ninth transistor T9. The second semiconductor portion may include a semiconductor ACT2 of the second transistor T2, a semiconductor ACT3 of the third transistor T3, a semiconductor ACT4 of the fourth transistor T4, and a semiconductor ACT5 of the fifth transistor T5.

The semiconductor ACT1 of the driving transistor T1 of the first semiconductor portion may overlap a portion of the first metal pattern BML1 in a plan view, it may extend to one side, so that the semiconductor ACT6 of the sixth transistor T6 may be disposed there, and it may extend to the other side and may be divided into two portions, so that the semiconductor ACT7 of the seventh transistor T7 and the semiconductor ACT8 of the eighth transistor T8 may be disposed there. The semiconductor ACT6 of the sixth transistor T6 may be disposed at a portion overlapping a downward protrusion of the first light emitting control line 153 in a plan view, and may extend an additional width. The semiconductor ACT7 of the seventh transistor T7 may be disposed at a portion overlapping a downward extension of the third scan line 154 in a plan view, and the semiconductor ACT8 of the eighth transistor T8 may be disposed at a portion overlapping an upward protrusion of the second light emitting control line 155 in a plan view. The semiconductor ACT8 of the eighth transistor T8 may be further extended so that the semiconductor ACT9 of the ninth transistor T9 may be disposed there, and the semiconductor ACT9 of the ninth transistor T9 may be disposed at a portion overlapping a downward extension of the third scan line 154 in a plan view. The semiconductor ACT7 of the seventh transistor T7 and the semiconductor ACT9 of the ninth transistor T9 may be further extended, respectively, and may have a wider extension.

The semiconductor ACT2 of the second transistor T2 of the second semiconductor portion may be at a portion overlapping an upward extension of the first scan line 151 in a plan view, and may be extended to one side so that the semiconductor ACT3 of the third transistor T3 may be disposed there, and may be extended to the other side and may have an extension. The semiconductor ACT3 of the third transistor T3 may be disposed at a portion overlapping an upward protrusion of the first light emission control line 153 in a plan view, and may be further extended and separated into two portions so that the semiconductor ACT4 of the fourth transistor T4 and the semiconductor ACT5 of the fifth transistor T5 may be disposed there. The semiconductor ACT4 of the fourth transistor T4 may be disposed at a portion overlapping a portion of the second scan line 152 in a plan view. The semiconductor ACT5 of the fifth transistor T5 may be disposed at a portion overlapping a downward protrusion of the second scan line 152 in a plan view. The semiconductor ACT4 of the fourth transistor T4 and the semiconductor ACT5 of the fifth transistor T5 may be further extended, respectively, and may have a wider width extension.

Referring to FIG. 17, a first gate insulating film 141 may be disposed on the semiconductor layer. The first gate insulating film 141 may be an inorganic insulating film including a silicon oxide (SiOx), a silicon nitride (SiNx), or a silicon oxynitride (SiONx).

Figure 10:
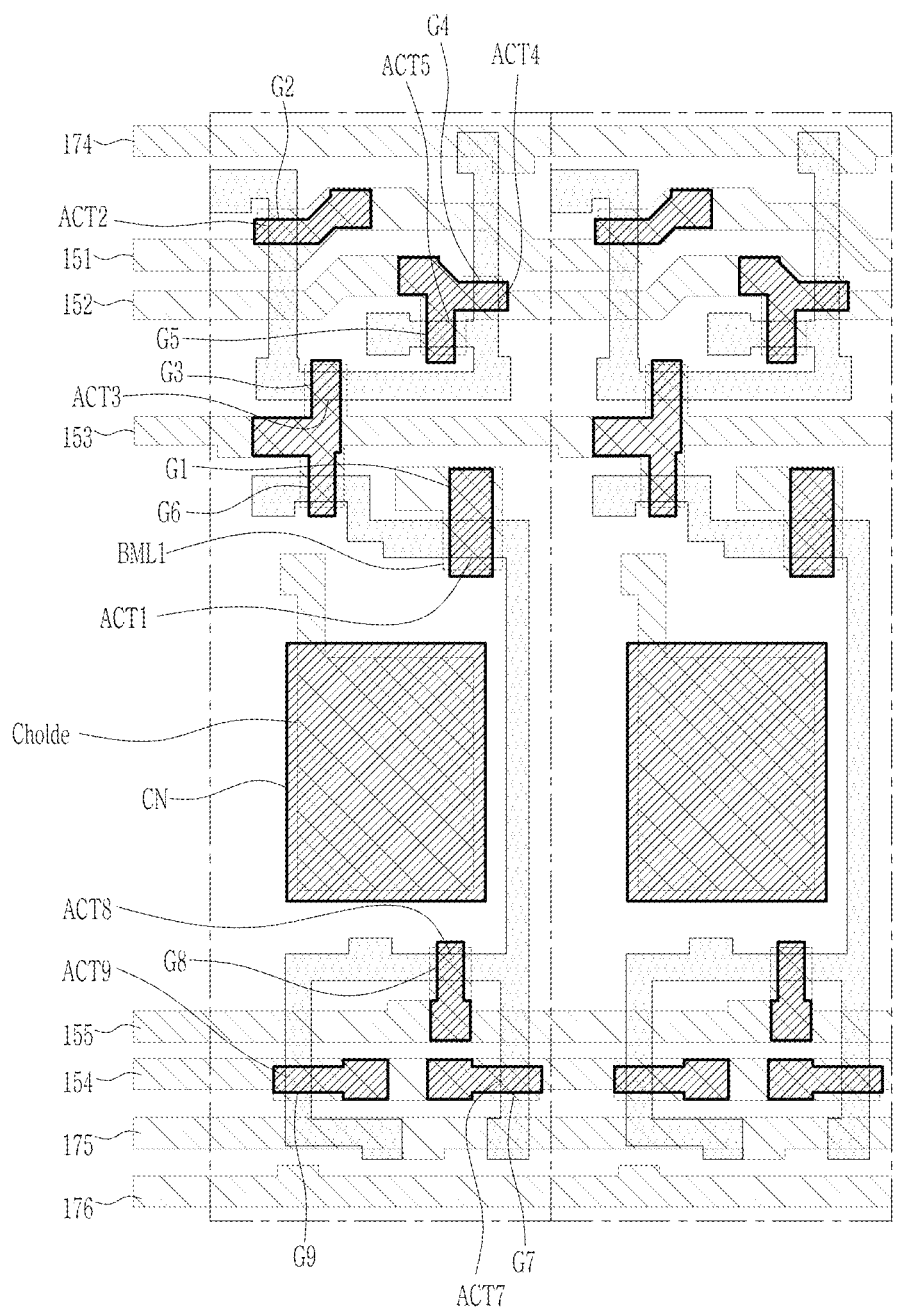

Referring to FIG. 10, on the first gate insulating film 141, a first gate conductive layer that may include gate electrodes G1, G2, G3, G4, G5, G6, G7, G8, and G9 of the transistors T1, T2, T3, T4, T5, T6, T7, T8, and T9 and an N node electrode CN may be disposed.

The gate electrodes G1, G2, G3, G4, G5, G6, G7, G8, and G9 of the transistors T1, T2, T3, T4, T5, T6, T7, T8, and T9 may be disposed to overlap the semiconductors ACT1, ACT2, ACT3, ACT4, ACT5, ACT6, ACT7, ACT8, and ACT9 of the semiconductor layer in a plan view, respectively. The gate electrode G3 of the third transistor T3 and the gate electrode G6 of the sixth transistor T6 may be integral with each other, and the gate electrode G4 of the fourth transistor T4 and the gate electrode G5 of the fifth transistor T5 may be integral with each other.

The N node electrode CN may be disposed to overlap the first electrode Cholde of the hold capacitor Chold disposed on the metal layer in a plan view. The hold capacitor Chold may be formed at a portion in which the first electrode Cholde of the hold capacitor Chold and the N node electrode CN overlap in a plan view, the first electrode Cholde of the hold capacitor Chold and the N node electrode CN may be the first electrode and the second electrode of the hold capacitor Chold, and the buffer layer 111 and the first gate insulating film 141 disposed therebetween may be an insulating layer of the hold capacitor Chold.

The first gate conductive layer may include a metal such as copper (Cu), molybdenum (Mo), aluminum (Al), or titanium (Ti), or a metal alloy thereof, and may be formed as a single layer or multilayer.

After the first gate conductive layer is stacked, a plasma treatment or doping process may be performed to make conductive the portion of the semiconductor layer that may not be overlapped in a plan view by the first gate conductive layer. For example, the semiconductor layer covered by the first gate conductive layer may not be conductive. However, the portion of the first semiconductor layer that may not be covered by the first gate conductive layer in a plan view may have substantially the same or similar characteristics as the conductive layer. As a result, the conductive portion of the semiconductor layer may be formed into the first electrode or the second electrode of the transistors, and the semiconductor layer covered by the first gate conductive layer among the semiconductor layers may be formed into the channel portions of the transistors.

Referring to FIG. 17, a second gate insulating film 142 may be disposed on the first gate conductive layer and the first gate insulating film 141. The second gate insulating film 142 may be an inorganic insulating film including a silicon oxide (SiOx), a silicon nitride (SiNx), or a silicon oxynitride (SiONx).

Figure 11:
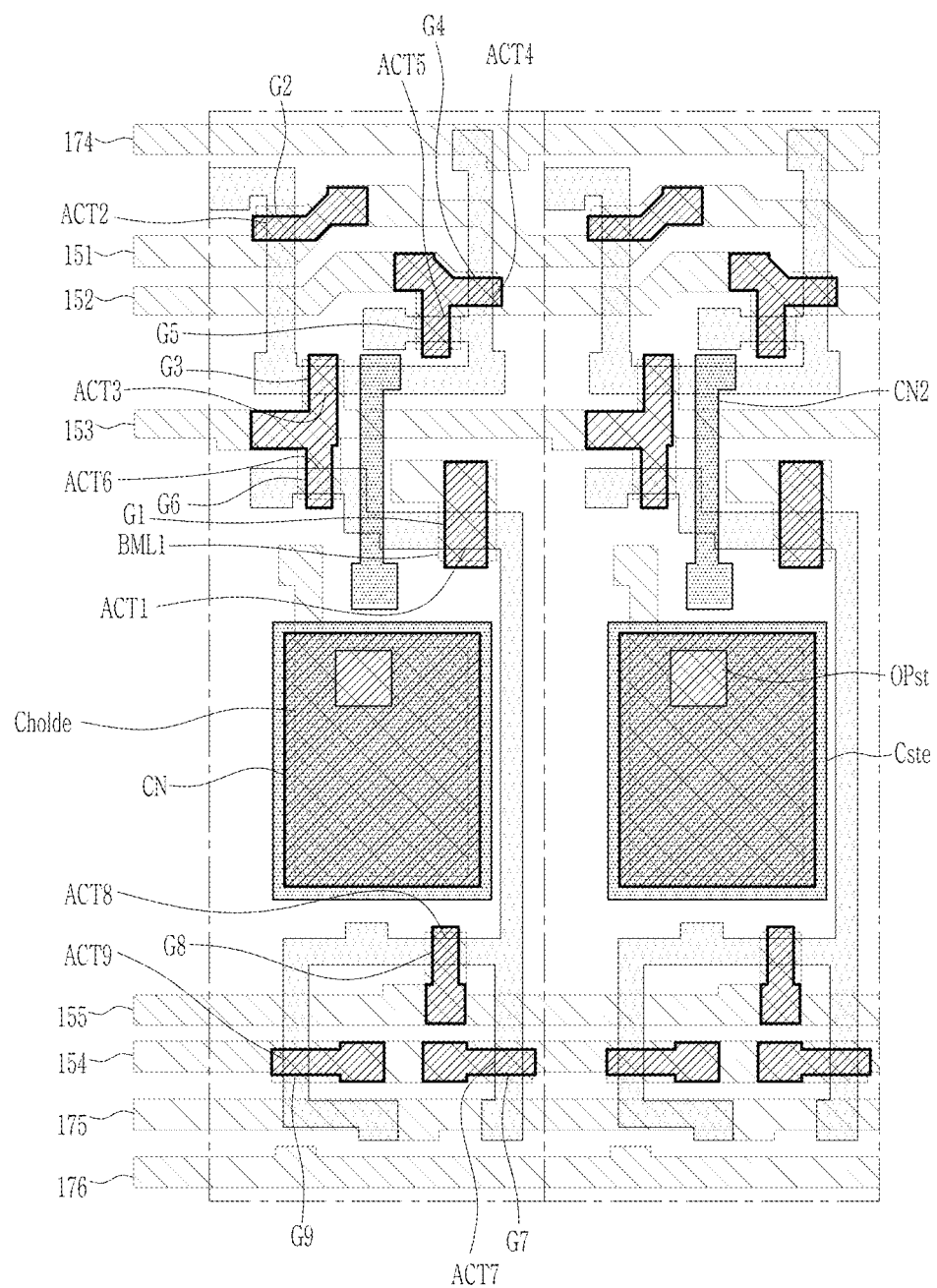

Referring to FIG. 11, on the second gate insulating film 142, a second gate conductive layer including a first storage electrode Cste of the storage capacitor Cst and an N node connection member CN2 (hereinafter, also referred to as a first node connection member) may be positioned.

The first storage electrode Cste of the storage capacitor Cst may include an opening OPst, and may be formed at a position overlapping the N node electrode CN disposed in the first gate conductive layer in a plan view, and the opening OPst of the first storage electrode Cste of the storage capacitor Cst may also be formed at a position overlapping the N node electrode CN in a plan view. The storage capacitor Cst is formed at a portion in which the first storage electrode Cste of the storage capacitor Cst and the N node electrode CN overlap in a plan view, the first storage electrode Cste of the storage capacitor Cst and the N node electrode CN may form the first electrode and the second electrode of the storage capacitor Cst, and the second gate insulating film 142 disposed therebetween may form an insulating layer of the storage capacitor Cst. Referring to an enlarged portion of FIG. 17, the hold capacitor Chold and the storage capacitor Cst may vertically overlap each other, and the N node electrode CN may be commonly included in the hold capacitor Chold and the storage capacitor Cst.

The N node connection member CN2 may extend in a longitudinal direction (second direction), and one end of the N node connection member CN2 may have an extension, and may be disposed at a position that is adjacent to an extension of the semiconductor ACT5 of the fifth transistor T5 in a plan view. The other end of the N node connection member CN2 may extend to a portion adjacent to the first storage electrode Cste of the storage capacitor Cst.

The second gate conductive layer may include a metal such as copper (Cu), molybdenum (Mo), aluminum (Al), or titanium (Ti), or a metal alloy thereof, and may be formed as a single layer or multilayer.

Referring to FIG. 17, a first interlayer insulating film 161 may be disposed on the second gate conductive layer. The first interlayer insulating film 161 may include an inorganic insulating film including a silicon oxide (SiOx), a silicon nitride (SiNx), and a silicon oxynitride (SiONx), and in some embodiments, the inorganic insulating material may be thickly formed in the first interlayer insulating film 161.

Figure 12:
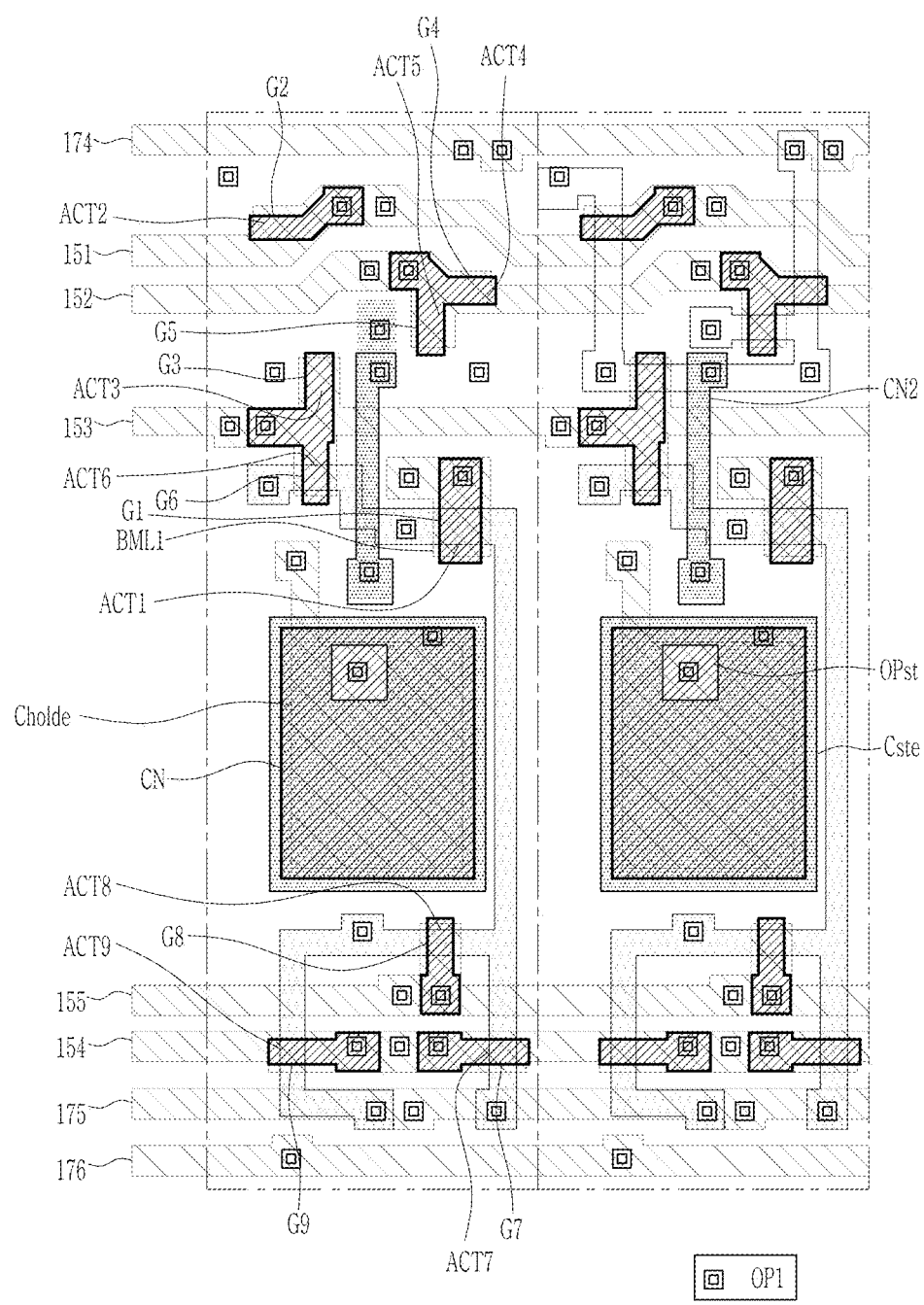

Referring to FIG. 12, an opening OP1 may be formed in the first interlayer insulating film 161 and the insulating film (the buffer layer 111, the first gate insulating film 141, and the second gate insulating film 142) disposed below. For example, in the opening OP1, an opening may be formed in at least one of the buffer layer 111, the first gate insulating film 141, the second gate insulating film 142, and the first interlayer insulating film 161, and may expose the metal layer, the semiconductor layer, the first gate conductive layer, or the second gate conductive layer disposed below.

Figure 13:
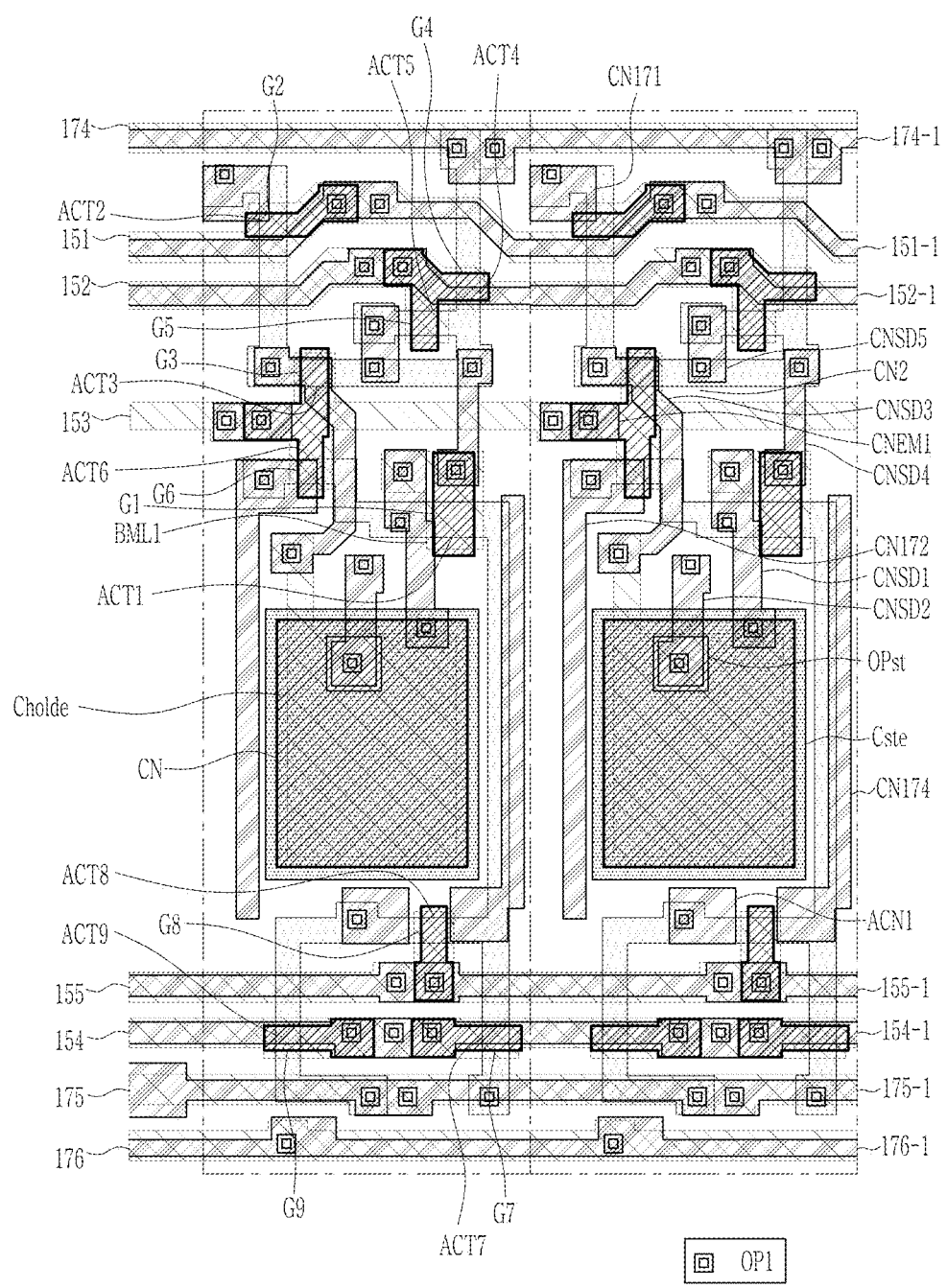

Referring to FIG. 13, a first data conductive layer may be disposed on the first interlayer insulating film 161.

The first data conductive layer may include a (1-1)-th scan line 151-1, a (2-1)-th scan line 152-1, a (3-1)-th scan line 154-1, a (2-1)-th light emitting control line 155-1, a second reference voltage line 174-1, a second initialization voltage line 175-1, a second driving low voltage line 176-1, connection members CNSD1, CNSD2, CNSD3, CNSD4, CNSD5, and CNEM1, and auxiliary connection portions CN171, CN172, CN174, and ACN1.

The (1-1)-th scan line 151-1, the (2-1)-th scan line 152-1, the (3-1)-th scan line 154-1, the (2-1)-th light emitting control line 155-1, the second reference voltage line 174-1, the second initialization voltage line 175-1, and the second driving low voltage line 176-1 may extend in the horizontal direction (first direction), and may overlap the first scan line 151, the second scan line 152, the third scan line 154, the second light emitting control line 155, the reference voltage line 174, the initialization voltage line 175, and the driving low voltage line 176, respectively. The (1-1)-th scan line 151-1, the (2-1)-th scan line 152-1, the (3-1)-th scan line 154-1, the (2-1)-th light emitting control line 155-1, the second reference voltage line 174-1, the second initialization voltage line 175-1, and the second driving low voltage line 176-1 respectively have at least one protrusion or extension, and may respectively be connected to the first scan line 151, the second scan line 152, the third scan line 154, the second light emitting control line 155, the reference voltage line 174, the initialization voltage line 175, and the driving low voltage line 176 through the opening OP1.

The (1-1)-th scan line 151-1, the (2-1)-th scan line 152-1, the (3-1)-th scan line 154-1, and the (2-1)-th light emitting control line 155-1 disposed on the first data conductive layer may be respectively connected to the first scan line 151, the second scan line 152, the third scan line 154, and the second light emitting control line 155 disposed on the metal layer, and may be respectively connected to the gate electrodes of respective transistors, which will be described in detail as follows.

The gate electrode G2 of the second transistor T2 disposed on the first gate conductive layer may be connected to the first scan line 151 and the (1-1)-th scan line 151-1 through the opening OP1, and the gate electrode G4 of the fourth transistor T4 and the gate electrode G5 of the fifth transistor T5 disposed on the first gate conductive layer may be connected to the second scan line 152 and the (2-1)-th scan line 152-1. The gate electrode G7 of the seventh transistor T7 and the gate electrode G9 of the ninth transistor T9 disposed on the first gate conductive layer may be connected to the third scan line 154 and the (3-1)-th scan line (154-1), and the gate electrode G8 of the eighth transistor T8 disposed on the first gate conductive layer may be connected to the second light emitting control line 155 and the (2-1)-th light emitting control line 155-1. The gate electrode G3 of the third transistor T3 and the gate electrode G6 of the sixth transistor T6 disposed on the first gate conductive layer may be connected to the first light emitting control line 153.

The first connection member CNSD1 may extend in the vertical direction (second direction) and extensions may be disposed at both ends thereof, and the extension at one side may be connected to the first storage electrode Cste of the storage capacitor Cst through the opening OP1, while the extension at the other side may be connected to the first metal pattern BML1 through the opening OP1. The extension at the other side of the first connection member CNSD1 may be connected to the semiconductor layer through another opening OP1, and the semiconductor layer to which the extension at the other side of the first connection member CNSD1 may be connected may be disposed between the semiconductor ACT1 of the driving transistor T1 and the semiconductor ACT6 of the sixth transistor T6.

The second connection member CNSD2 may extend in the vertical direction (second direction) and extensions are disposed at both ends thereof, and the extension at one side may be connected to the N node connection member CN2 through the opening OP1, while the extension at the other end may be connected to the N node electrode CN through the opening OP1 and the opening OPst of the first storage electrode Cste.

The third connection member CNSD3 may have a bent structure and extensions may be disposed at both ends. The extension at one side may be connected to the connection portion protruding from the first electrode Cholde of the hold capacitor Chold through the opening OP1, while the extension at the other side may be connected to the semiconductor layer through the opening OP1. The semiconductor layer to which the extension at the other side of the third connection member CNSD3 may be connected may be connected between the semiconductor ACT2 of the second transistor T2 and the semiconductor ACT3 of the third transistor T3.

The fourth connection member CNSD4 may extend in the vertical direction (second direction) and extensions may be disposed at both ends, and the extension at one side may be connected to the gate electrode G1 of the driving transistor T1 through the opening OP1, while the extension at the other side may be connected to the semiconductor layer through the opening OP1. The semiconductor layer to which the extension at the other side of the fourth connection member CNSD4 may be connected may be an extension adjacent to the semiconductor ACT4 of the fourth transistor T4 and the semiconductor ACT5 of the fifth transistor T5, and it may be connected to a portion that may also be connected to the semiconductor ACT3 of the third transistor T3.

The fifth connection member CNSD5 may extend in the vertical direction (second direction), and may connect one end of the N node connection member CN2 and an extension of the semiconductor ACT5 of the fifth transistor T5 through the opening OP1.

The sixth connection member CNEM1 may connect the first light emitting control line 153 with the gate electrode G3 of the third transistor T3 and the gate electrode of the sixth transistor T6 through the opening OP1. The gate electrode GE of the third transistor T3 and the gate electrode of the sixth transistor T6 may be integral with each other.

The first auxiliary connection portion CN171 may have an island structure, and may be connected to an extension adjacent to the semiconductor ACT2 of the second transistor T2 through the opening OP1.

The second auxiliary connection portion CN172 may further include an extension connected to an extension adjacent to the semiconductor ACT6 of the sixth transistor T6 through the opening OP1, and an extension that extends long in the vertical direction from the extension. The extension may shield other components.

The third auxiliary connection portion CN174 may include an extension and another long extension that vertically extends from the extension.

The first anode connection portion ACN1 may be connected to the semiconductor layer through the opening OP1, and the semiconductor layer to which the first anode connection portion ACN1 may be connected may be disposed between the semiconductor ACT8 of the eighth transistor T8 and the semiconductor ACT9 of the ninth transistor T9.

The first data conductive layer may include a metal such as aluminum (Al), copper (Cu), molybdenum (Mo), or titanium (Ti), or a metal alloy thereof, and may be formed as a single layer or multilayer.

Referring to FIG. 17, a first organic film 180 may be disposed on the first data conductive layer. The first organic film 180 may be an organic insulation film including an organic material, and the organic material may include one or more of polyimide, polyamide, an acryl resin, benzocyclobutene, and a phenol resin.

Referring to FIG. 14, an opening OP2 may be disposed on the first organic film 180. The opening OP2 of the first organic layer 180 may expose the first data conductive layer, and the exposed first data conductive layer may be portions of the first auxiliary connection portion CN171, the second auxiliary connection portion CN172, the third auxiliary connection portion CN174, the first anode connection portion ACN1, the second reference voltage line 174-1, and the second initialization voltage line 175-1.

Referring to FIG. 15, a second data conductive layer may be disposed on the first organic film 180, and the second data conductive layer may include the data line 171, the third driving low voltage line 176-2 (hereinafter also referred to as a driving low voltage line), the third reference voltage line 174-2, the third initialization voltage line 175-2, and the second anode connection portion ACN2.

The data line 171 may be connected to the first auxiliary connection portion CN171 through the opening OP2, the third driving low voltage line 176-2 may be connected to the second auxiliary connection portion CN172 and the second driving low voltage line 176-1 through the opening OP2, the third reference voltage line 174-2 may be connected to the second reference voltage line 174-1 and the third auxiliary connection part CN174 through the opening OP2, and the third initialization voltage line 175-2 may be connected to the second initialization voltage line 175-1 through the opening OP2.

The second anode connection portion ACN2 may be connected to the first anode connection portion ACN1 through the opening OP2.

The second data conductive layer may include a metal such as aluminum (Al), copper (Cu), molybdenum (Mo), or titanium (Ti), or a metal alloy thereof, and may be formed as a single layer or multilayer.

Referring to FIG. 17, a second organic film 181 may be disposed on the second data conductive layer. The second organic film 181 may be an organic insulating film, and may include one or more of polyimide, polyamide, an acryl resin, benzocyclobutene, and a phenol resin.

Although not shown in FIG. 17, an anode may be disposed on the second organic film 181, and the anode may be connected to the second anode connection portion ACN2.

FIG. 16 illustrates signals or voltages applied to respective portions in a planar structure in which all of the above-described layers are stacked, and illustrates which portions are the transistors T1, T2, T3, T4, T5, T6, T7, T8, and T9 and the capacitors Chold and Cst in a plan view.

FIG. 16 illustrates cross-sectional lines XVII-XVII' and XVII'-XVII'', and FIG. 17 illustrates a schematic cross-sectional view taken along the cross-sectional lines of FIG. 16.

Based on the planar structure as described above, the cross-sectional structure taken along the cross-sectional lines XVII-XVII' and XVII'-XVII'' of FIG. 16 will be described with reference to FIG. 17.

A metal layer including the first electrode Cholde of the hold capacitor Chold may be disposed on the substrate 110.

The buffer layer 111 covering the metal layer may be disposed on the metal layer, the semiconductor layer may be disposed on the buffer layer 111, and the first gate insulating film 141 may be disposed on the semiconductor layer.

The first gate conductive layer including the N node electrode CN may be disposed on the first gate insulating film 141.

The second gate insulating film 142 may be disposed on the first gate conductive layer, and the second gate conductive layer including the first storage electrode Cste of the storage capacitor Cst and the N node connection member CN2 may be disposed on the second gate insulating film 142.

The first interlayer insulating film 161 may be disposed on the second gate conductive layer, and the first data conductive layer including the first connection member CNSD1, the second connection member CNSD2, and the third connection member CNSD3 may be disposed on the first interlayer insulating film 161.

Referring to FIG. 17, the first connection member CNSD1 may be connected to the first storage electrode Cste of the storage capacitor Cst through the opening OP1. Although not shown in FIG. 17, the other end of the first connection member CNSD1 may be connected to the first metal pattern BML1 and the semiconductor layer, and the semiconductor layer to which the extension of the other side of the first connection member CNSD1 is disposed between the semiconductor ACT1 of the driving transistor T1 and the semiconductor ACT6 of the sixth transistor T6.

Referring to FIG. 17, the extension of one side of the second connection member CNSD2 may be connected to the N node connection member CN2 through the opening OP1, and the extension of the other side may be connected to the N node electrode CN through the opening OP1 and the opening OPst of the first storage electrode Cste.

Referring to FIG. 17, the third connection member CNSD3 may be connected to the connection portion protruding from the first electrode Cholde of the hold capacitor Chold through the opening OP1, and although not shown in FIG. 17, the extension of the other side may be connected to the semiconductor layer through the opening OP1, and the semiconductor layer connecting the extension of the other side of the third connection member CNSD3 may be disposed between the semiconductor ACT2 of the second transistor T2 and the semiconductor ACT3 of the third transistor T3.

Referring to FIG. 17, the first organic film 180 is disposed on the first data conductive layer, and the second data conductive layer including the driving low voltage line 176 may be disposed on the first organic film 180. The second organic film 181 may be disposed on the second data conductive layer.

Although a structure of an upper portion of the second organic film 181 is not shown in FIG. 17, it may follow the structure below.

An anode may be disposed on the second organic film 181, and a pixel defining film covering at least a portion of the anode while having an opening exposing the anode may be disposed on the anode. The pixel defining film may include a black color pigment, or may be formed of a transparent organic material.

A spacer may be disposed on the pixel defining film, and a functional layer and a cathode may be sequentially formed on the anode, the spacer, and the pixel defining film. A light emitting layer may be disposed between the functional layers, and the light emitting layer may be disposed only within an opening of the pixel defining film. The functional layer may include at least one of auxiliary layers such as an electron injection layer, an electron transport layer, a hole transport layer, and a hole injection layer. The driving voltage ELVDD may be applied to the cathode by being connected to the driving voltage line 172.

An encapsulation layer is disposed on the cathode, and the encapsulation layer includes at least one inorganic layer and at least one organic layer, and in some embodiments, it may have a triple-layered structure including a first inorganic encapsulation layer, an organic encapsulation layer, and a second inorganic encapsulation layer.

In some embodiments, a sensing insulating layer and sensing electrodes may be included on the encapsulation layer for touch sensing.

A light blocking member and a color filter layer may be disposed on the sensing insulating layer and the sensing electrodes.

Referring to FIG. 17, an enlarged view of a partial region is shown, and in the region, from the bottom, the first electrode Cholde of the hold capacitor Chold, the buffer layer 111, the first gate insulating film 141, the N node electrode CN, the second gate insulating film 142, the first storage electrode Cste of the storage capacitor Cst, and the first interlayer insulating film 161 are sequentially stacked.

Among them, the first electrode Cholde of the hold capacitor Chold and the N node electrode CN overlap to form the hold capacitor Chold, and the N node electrode CN and the first storage electrode Cste of the storage capacitor Cst overlap to form the storage capacitor Cst.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting display device, comprising:
   a light emitting diode including:
     a first electrode; and
     a second electrode to which a driving voltage is applied;
   a driving transistor including:
     a gate electrode;
     a first electrode; and
     a second electrode;
   a second transistor including:
     a gate electrode;
     a first electrode electrically connected to a data line to which a data voltage is applied; and
     a second electrode electrically connected to a D node;
   a storage capacitor including:
     a first electrode electrically connected to the first electrode of the driving transistor; and
     a second electrode electrically connected to an N node;
   a hold capacitor including:
     a first electrode electrically connected to the D node; and
     a second electrode electrically connected to the N node;
   a third transistor including:
     a gate electrode;
     a first electrode electrically connected to the D node; and
     a second electrode electrically connected to the gate electrode of the driving transistor;
   a fourth transistor including:
     a gate electrode;
     a first electrode electrically connected to the gate electrode of the driving transistor; and
     a second electrode receiving a reference voltage;
   a fifth transistor including:
     a gate electrode;
     a first electrode electrically connected to the gate electrode of the driving transistor; and
     a second electrode electrically connected to the N node;

a sixth transistor including:
- a gate electrode;
- a first electrode electrically connected to the first electrode of the driving transistor; and
- a second electrode receiving a driving low voltage;

a seventh transistor including:
- a gate electrode;
- a first electrode electrically connected to the second electrode of the driving transistor; and
- a second electrode receiving an initialization voltage; and an eighth transistor including:
- a gate electrode;
- a first electrode electrically connected to the second electrode of the driving transistor; and
- a second electrode electrically connected to the first electrode of the light emitting diode.

2. The light emitting display device of claim 1, wherein:
the driving voltage has a value of a high level;
the initialization voltage and the driving voltage have substantially a same value, or the initialization voltage has a value of a high level corresponding to the value of the driving voltage;
the driving low voltage has a value of a low level; and
the reference voltage has a value of a high level.

3. The light emitting display device of claim 2, wherein:
the storage capacitor stores a voltage of the first electrode of the driving transistor; and
the hold capacitor stores the data voltage outputted from the second transistor.

4. The light emitting display device of claim 3, wherein:
the gate electrode of the second transistor is electrically connected to a first scan line;
the gate electrode of the fourth transistor and the gate electrode of the fifth transistor are electrically connected to a second scan line;
the gate electrode of the third transistor and the gate electrode of the sixth transistor are electrically connected to a first light emitting control line;
the gate electrode of the seventh transistor is electrically connected to a third scan line; and
the gate electrode of the eighth transistor is electrically connected to a second light emitting control line.

5. The light emitting display device of claim 4, wherein in an initializing period, the third transistor, the fourth transistor, the fifth transistor, and the sixth transistor are turned on.

6. The light emitting display device of claim 4, wherein in a writing period, the second transistor, the fourth transistor, and the fifth transistor are turned on.

7. The light emitting display device of claim 4, wherein in a compensating period, the fourth transistor, the fifth transistor, and the seventh transistor are turned on.

8. The light emitting display device of claim 7, further comprising:
a ninth transistor including:
- a gate electrode;
- a first electrode electrically connected to the first electrode of the light emitting diode; and
- a second electrode to which the initialization voltage is applied, wherein
the gate electrode of the ninth transistor is electrically connected to the third scan line, and
in the compensating period, the ninth transistor is turned on.

9. The light emitting display device of claim 4, wherein in a light emitting period, the third transistor, the sixth transistor, and the eighth transistor are turned on.

* * * * *